US010031606B2

(12) United States Patent
Yoshida et al.

(10) Patent No.: US 10,031,606 B2
(45) Date of Patent: Jul. 24, 2018

(54) PRESSURE DETECTING DEVICE AND TOUCH PANEL

(71) Applicants: MITSUI CHEMICALS, INC., Tokyo (JP); Murata Manufacturing Co., Ltd., Nagaokakyo-shi, Kyoto (JP)

(72) Inventors: Mitsunobu Yoshida, Ichihara (JP); Kazuhiro Tanimoto, Nagoya (JP); Shigeo Nishikawa, Chiba (JP)

(73) Assignees: MITSUI CHEMICALS, INC., Minato-Ku, Tokyo (JP); MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 18 days.

(21) Appl. No.: 14/891,165

(22) PCT Filed: May 16, 2014

(86) PCT No.: PCT/JP2014/063100
§ 371 (c)(1),
(2) Date: Nov. 13, 2015

(87) PCT Pub. No.: WO2014/185530
PCT Pub. Date: Nov. 20, 2014

(65) Prior Publication Data

US 2016/0092016 A1 Mar. 31, 2016

(30) Foreign Application Priority Data

May 16, 2013 (JP) ................................ 2013-104398

(51) Int. Cl.
*G06F 3/041* (2006.01)
*C08L 67/04* (2006.01)
(Continued)

(52) U.S. Cl.
CPC ............ *G06F 3/0414* (2013.01); *C08L 67/04* (2013.01); *G01L 1/16* (2013.01); *G06F 3/041* (2013.01);
(Continued)

(58) Field of Classification Search
CPC .. G06F 3/041; G06F 3/04842; G06F 3/04845; G06F 3/04847; G06F 3/04883; G06F 3/04886; G06F 3/16
See application file for complete search history.

(56) References Cited

U.S. PATENT DOCUMENTS

2008/0018201 A1 1/2008 Matsumoto
2012/0075226 A1* 3/2012 Andoh .................... G06F 3/046 345/173
(Continued)

FOREIGN PATENT DOCUMENTS

JP S61-066967 U 5/1986
JP 01-130215 A 5/1989
(Continued)

OTHER PUBLICATIONS

International Search Report (PCT/ISA/210) dated Jun. 24, 2014, by the Japanese Patent Office as the International Searching Authority for International Application No. PCT/JP2014/063100.
(Continued)

*Primary Examiner* — Olga Merkoulova
(74) *Attorney, Agent, or Firm* — Buchanan, Ingersoll & Rooney PC

(57) ABSTRACT

The invention provides a pressure detecting device containing a pressurized member having a contact surface that is subjected to pressure due to contact with a pressurizing means; and a piezoelectric member that is arranged facing the pressurized member and that includes a polymeric piezoelectric material having a piezoelectric constant $d_{14}$ of
(Continued)

1 pm/V or more as measured by a displacement method at 25° C., and a ratio IEb/IEa between a product IEb of a cross-sectional secondary moment Ib and a Young's modulus Eb of the pressurized member, and a product IEa of a cross-sectional secondary moment Ia and a Young's modulus Ea of the piezoelectric member, is in a range of from $10^2$ to $10^{10}$.

15 Claims, 3 Drawing Sheets

(51) Int. Cl.

| | |
|---|---|
| ***G01L 1/16*** | (2006.01) |
| ***H01L 41/193*** | (2006.01) |
| ***H01L 41/113*** | (2006.01) |

(52) U.S. Cl.

CPC ........ *H01L 41/1132* (2013.01); *H01L 41/193* (2013.01); *G06F 2203/04105* (2013.01)

(56) References Cited

U.S. PATENT DOCUMENTS

2012/0120307 A1* 5/2012 Shimada .................. B08B 7/02 348/373
2014/0084204 A1* 3/2014 Tanimoto .................. C08J 5/18 252/62.9 R

FOREIGN PATENT DOCUMENTS

| | | | |
|---|---|---|---|
| JP | 2008-27016 | A | 2/2008 |
| JP | 2010-211482 | A | 9/2010 |
| JP | 2011-043442 | A | 3/2011 |
| WO | WO 2010/143528 | A1 | 12/2010 |
| WO | WO 2011/125408 | A1 | 10/2011 |
| WO | WO 2011/138903 | A1 | 11/2011 |
| WO | WO 2012/049969 | A1 | 4/2012 |
| WO | WO 2013/054918 | A1 | 4/2013 |

OTHER PUBLICATIONS

Written Opinion (PCT/ISA/237) dated Jun. 24, 2014, by the Japanese Patent Office as the International Searching Authority for International Application No. PCT/JP2014/063100 and English translation.

* cited by examiner

PRESSURE DETECTING DEVICE AND TOUCH PANEL

TECHNICAL FIELD

The present invention relates to a pressure detecting device and a touch panel.

BACKGROUND ART

As a piezoelectric material, PZT (a $PBZrO_3$—$PbTiO_3$ solid solution), which is a ceramic material, has been used in many cases. However, PZT contains lead, polymeric piezoelectric materials with low environmental load and a high degree of flexibility have been increasingly employed.

Currently known polymeric piezoelectric materials are roughly classified mainly into the following two types, i.e., poled polymers typified by nylon 11, polyvinyl fluoride, polyvinyl chloride, and polyurea, polyvinylidene fluoride (β type) (PVDF), and ferroelectric polymers typified by a polyvinylidene fluoride-trifluoroethylene copolymer (P(VDF-TrFE)) (75/25).

In recent years, use of polymers having optical activity, such as polypeptide or polylactic acid, is attracting attention, in addition to the polymeric piezoelectric materials described above. Polylactic acid-based polymers are known to demonstrate piezoelectricity by carrying out a mechanical stretching alone.

Among the polymers having optical activity, piezoelectricity of polymer crystals, such as polylactic acid, is supposed to originate from permanent dipoles of a C═O bond being present in a screw axis direction. In particular, polylactic acid, which has a small volume fraction of a side chain to a main chain and a high ratio of permanent dipoles per volume, is an ideal polymer among polymers having helical chirality.

It is known that polylactic acid, which demonstrates piezoelectricity by a stretching process alone, does not require a poling process, and that the piezoelectric modulus is less likely to decrease over the years.

As a device using a polylactic acid-based polymer as a polymeric piezoelectric material, a touch panel provided with a piezoelectric sheet of polylactic acid is proposed, for example (see, for example, WO2010/143528, WO2011/125408, WO2012/049969, and WO2011/138903).

SUMMARY OF INVENTION

Technical Problem

An object of the invention is to provide a pressure detecting device and a touch panel using a polymeric piezoelectric material and having high detection sensitivity.

Solution to Problem

In order to achieve the above object, the following inventions are provided.

<1> A pressure detecting device containing:

a pressurized member having a contact surface that is subjected to pressure due to contact with a pressurizing means; and a piezoelectric member that is arranged facing the pressurized member and that includes a polymeric piezoelectric material having a piezoelectric constant $d_{14}$ of 1 pm/V or more as measured by a displacement method at 25° C., wherein a ratio IEb/IEa between a product IEb of a cross-sectional secondary moment Ib and a Young's modulus Eb of the pressurized member, and a product IEa of a cross-sectional secondary moment Ia and a Young's modulus Ea of the piezoelectric member, is in a range of from $10^2$ to $10^{10}$.

<2> The pressure detecting device described in <1> in which the ratio IEb/IEa is in a range of from $10^4$ to $10^9$.

<3> The pressure detecting device described in <1> or <2> in which the ratio IEb/IEa is in a range of from $10^5$ to $10^8$.

<4> The pressure detecting device described in any one of <1> to <3> further containing:

a support means configured to support the pressurized member against pressure that is applied from the contact surface; and a support means configured to support the piezoelectric member against pressure that is applied from the contact surface through the pressurized member.

<5> The pressure detecting device described in any one of <1> to <4> in which a direction in which pressure is applied from the contact surface and a molecular orientation direction of the polymeric piezoelectric material cross each other.

<6> The pressure detecting device described in any one of <1> to <5> in which a thickness of the pressurized member is in a range of from 0.2 mm to 20 mm.

<7> The pressure detecting device described in any one of <1> to <6> in which the Young's modulus Eb of the pressurized member is from 1 GPa to 200 GPa.

<8> The pressure detecting device described in any one of <1> to <7> further containing a relaxing portion that has a Young's modulus of 0.1 GPa or less and that is provided on an opposite side, from the pressurized member side, of the piezoelectric member.

<9> The pressure detecting device described in any one of <1> to <8> in which the polymeric piezoelectric material contains a helical chiral polymer having a weight average molecular weight of from 50,000 to 1,000,000 and optical activity, and has a crystallinity as obtained by a DSC method of from 20% to 80%, and a product of a standardized molecular orientation MORc, which is measured with a microwave transmission-type molecular orientation meter at a reference thickness of 50 μm, and the crystallinity is from 40 to 700.

<10> The pressure detecting device described in any one of <1> to <9> in which an internal haze of the polymeric piezoelectric material with respect to visible light is 10% or less.

<11> The pressure detecting device described in <9> or <10> in which the MORc is from 3.5 to 15.0.

<12> The pressure detecting device described in any one of <9> to <11> in which the helical chiral polymer is a polylactic acid-based polymer having a main chain that contains a repeating unit represented by the following Formula (1):

(1)

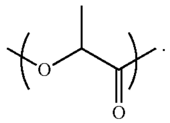

<13> The pressure detecting device described in any one of <9> to <12> in which the helical chiral polymer has an optical purity of not less than 95.00% ee.

<14> The pressure detecting device described in any one of <9> to <13> in which a content of the helical chiral polymer in the polymeric piezoelectric material is 80% by mass or more.

<15> The pressure detecting device described in any one of <9> to <14> in which the polymeric piezoelectric material further contains a stabilizer:

having one or more functional groups selected from the group consisting of a carbodiimide group, an epoxy group, and an isocyanate group, having a weight average molecular weight of from 200 to 60,000, and being contained in an amount from 0.01 parts by mass to 10 parts by mass based on 100 parts by mass of the helical chiral polymer.

<16> The pressure detecting device described in <15> in which the stabilizer has, in one molecule, one functional group selected from the group consisting of a carbodiimide group, an epoxy group, and an isocyanate group.

<17> A touch panel having the pressure detecting device described in any one of <1> to <16> and a display device.

Advantageous Effects of Invention

According to the invention, a pressure detecting device and a touch panel using a polymeric piezoelectric material and having high detection sensitivity are provided.

DESCRIPTION OF EMBODIMENTS

<Pressure Detecting Device>

Figure 1:
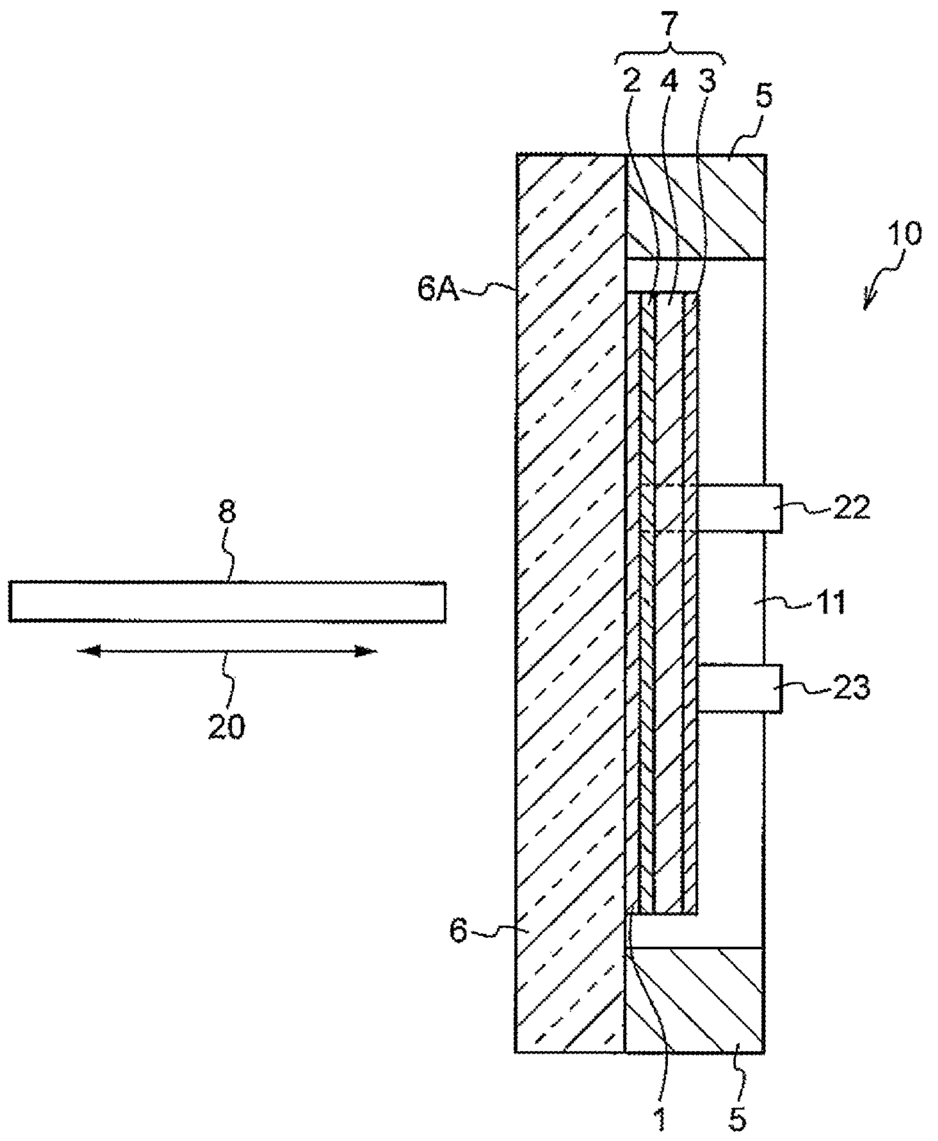
FIG. 1 is a cross-sectional view schematically showing a cross section in a thickness direction of one example of a pressure detecting device according to the present embodiment.

A pressure detecting device according to one embodiment of the invention includes a pressurized member having a contact surface that is subjected to pressure due to contact with a pressurizing means, and a piezoelectric member that is arranged facing the pressurized member and that includes a polymeric piezoelectric material, and a ratio IEb/IEa between a product IEb of a cross-sectional secondary moment Ib and a Young's modulus Eb of the pressurized member, and a product IEa of a cross-sectional secondary moment Ia and a Young's modulus Ea of the piezoelectric member, is in a range of from $10^2$ to $10^{10}$ The present inventors found that when a ratio IEb/IEa between a product IEb of a cross-sectional secondary moment Ib and a Young's modulus Eb of the pressurized member, and a product IEa of a cross-sectional secondary moment Ia and a Young's modulus Ea of the piezoelectric member, is preferably in the range of from $10^2$ to $10^{10}$, a generated charge density per unit quantity of deflection is high, that is, pressure that is applied to a contact surface of the pressurized member can be detected with high sensitivity. In terms of having higher detection sensitivity, IEb/IEa is preferably $10^3$ or more, more preferably $10^4$ or more, particularly preferably $10^5$ or more. Similarly, in terms of having higher detection sensitivity, IEb/IEa is preferably $10^9$ or less, more preferably $10^8$ or less, still more preferably $10^7$ or less.

IEb/IEa is preferably from $10^4$ to $10^9$, more preferably from $10^4$ to $10^8$, particularly preferably from $10^5$ to $10^8$.

In the present embodiment, the piezoelectric member may be arranged facing at least a portion of the pressurized member. In addition, in this embodiment, the pressurizing means, a portion of the pressurized member where the pressurizing means is in contact with, and the piezoelectric member may be arranged on the same straight line or need not be arranged on the same straight line.

[Cross-sectional Secondary Moment]

The cross-sectional secondary moment is a quantity representing difficulty in deformation of an object against a bending moment.

The cross-sectional secondary moment (Ib) of the pressurized member and the cross-sectional secondary moment (Ia) of the piezoelectric member constituting the pressure detecting device according to the present embodiment are obtained as follows.

If a member (the pressurized member and the piezoelectric member) has a rectangular flat plate shape, this member is considered to be a beam having a rectangular cross-sectional surface. In this case, the cross-sectional secondary moment I is generally calculated by the following equation (a) based on width b of the member and thickness h of the member:

$$I=(b\times h^3)/12 \qquad \text{(a)}$$

Provided that in a case in which a member (for example, a pressurized member (base material) 6 described below) is supported by a support means (for example, a support frame 5 described below), whereby only a portion of width of the member (hereinafter referred to as a "fixed end distance"; for example, a portion inner than an inner circumference of the support frame 5 described below) with respect to the applied pressure, is deformed, the cross-section secondary moment of the member is calculated by the equation:

$$\text{Fixed end distance}\times(\text{thickness of the member})^3/12.$$

Also, if the cross-sectional surface of the pressurized member or the piezoelectric member is not a short rectangular cross-sectional surface, the cross-section secondary moment is calculated assuming that the member has a short rectangular cross-sectional surface. The cross-section secondary moment is calculated by the equation:

$$\text{Fixed end distance}\times(\text{thickness of the member})^3/12.$$

The larger the cross-section secondary moment, the less the member is flexed. If the pressurized member is likely to be flexed rather than the piezoelectric member, pressure F applied to a contact surface is less likely to efficiently propagate to the piezoelectric member. Meanwhile, if the pressurized member is flexed too little, force is less likely to efficiently propagate to the piezoelectric member.

[Young's Modulus]

The Young's modulus (longitudinal elastic modulus) is a constant for determining a value showing that how much stress is required per unit quantity of deflection in an elastic range.

The respective Young's moduli (Eb and Ea) of the pressurized member and the piezoelectric member constituting the pressure detecting device according to the present embodiment are obtained as follows.

The Young's modulus (longitudinal elastic modulus) Ea of the piezoelectric member and the Young's modulus (longitudinal elastic modulus) Eb of the pressurized member formed of resin are measured by a tensile testing method in conformity with JIS K7127, using a No. 1 dumbbell specimen specified in JIS K6251. The Young's modulus is obtained as a slope (a linear portion) of an elastic range in a stress-strain diagram obtained by this specimen and this testing method. The Young's modulus of a pressurized member formed of a fragile material like glass is obtained by a static modulus measuring method in conformity with JIS R1602.

Hereinafter, the pressure detecting device of the present embodiment will be described more specifically.

Figure 2:
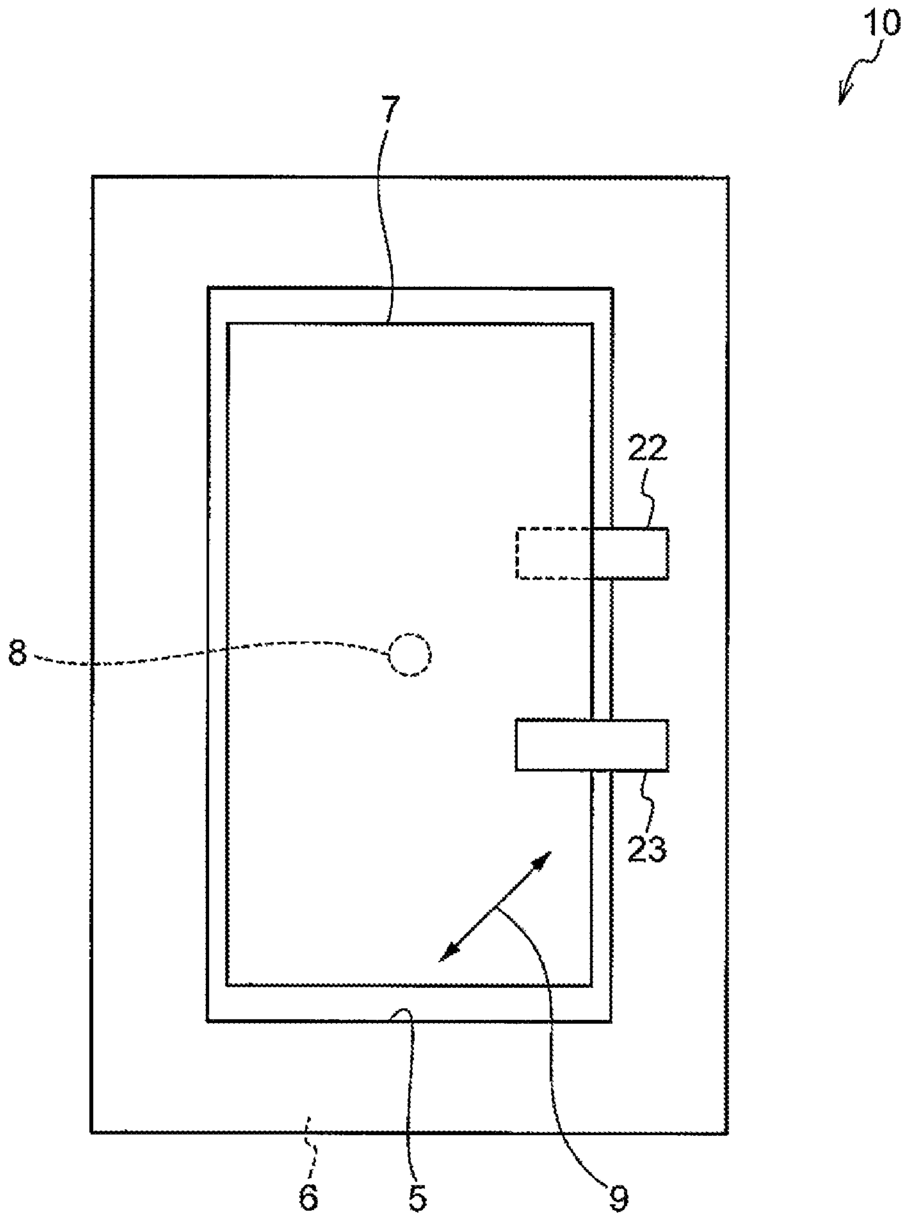
FIG. 2 is a plan view schematically showing an opposite side of a contact surface of the pressure detecting device shown in FIG. 1.

FIG. 1 is a cross-sectional view schematically showing a cross section in a thickness direction of one example of a pressure detecting device according to the present embodiment. FIG. 2 is a plan view showing an opposite side (a support frame side) of a contact surface of the pressure detecting device shown in FIG. 1.

A pressure detecting device 10 according to one example of the present embodiment includes a base material (a pressurized member) 6 having a contact surface 6A that is subjected to pressure due to contact with the pressurizing means 8, and a piezoelectric member 7 that is arranged facing the pressurized member 6. The piezoelectric member 7 is constituted of a polylactic acid (PLA) film (polymeric piezoelectric material) 4 and electrode layers (a first electrode layer 2 and a second electrode layer 3 provided on both surfaces of the PLA film 4.

In this example, copper foil tapes 22 and 23 each having a conductive adhesive layer, which serve as extraction electrodes, are applied respectively onto the first electrode layer 2 and the second electrode layer 3.

At each edge portion of a surface on the opposite side of the contact surface 6A of the base material 6, support frames 5, as a support means configured to support the base material 6 against the pressure that is applied from the contact surface 6A, are provided. The support frame 5 is applied onto the base material 6 through a double-sided tape, an adhesive, a sticker, or the like.

In this example, although the support frame 5 is provided at the edge portion of the surface of the base material 6, the present embodiment is not limited to this aspect, and the support frame 5 may be provided at an edge portion of a surface of the piezoelectric member 7. For example, if the base material 6 and the piezoelectric member 7 have similar sizes (including a case where they have the same size) or if the size of the piezoelectric member 7 is larger than the size of the base material 6, the support frame 5 may be provided at the edge portion of the piezoelectric member 7. Namely, it is only required that the support frame 5 is provided to permit supporting the base material 6 against the pressure that is applied from the contact surface 6A.

In this embodiment, the support means configured to support the pressurized member against the pressure that is applied from the contact surface is not limited to the support frame, but it is only required that the support means is a means configured to support the pressurized member (preferably at two or more points) against the pressure.

In the piezoelectric member 7, the first electrode layer 2 side of the PLA film 4 is applied on the base material 6 through a double-sided tape 1. The double-sided tape 1 functions as a support means configured to support the piezoelectric member 7 on the base material 6, and supports the piezoelectric member 7 on the base material 6 against the pressure that is applied to the contact surface 6A and propagating through the base material 6. The base material 6 is thus supported by the support frame 5, and, at the same time, the piezoelectric member 7 is supported by the base material 6 through the double-sided tape 1, whereby both the base material 6 and the piezoelectric member 7 are flexed when receiving the pressure through the contact surface 6A. According to this constitution, in the PLA film 4 in the piezoelectric member 7, an electric charge is generated at a position where the pressure is applied through the base material 6.

As the support means for supporting the piezoelectric member 7 on the base material 6, another support means such as an adhesive or a sticker may be used instead of the double-sided tape.

In the pressure detecting device of the present embodiment, although such an aspect is preferable that the entire principal surface of the piezoelectric member 7 is in contact with a principal surface of the pressurized member 6 through a double-sided tape or the like, there may be an aspect that the piezoelectric member 7 is supported at at least two positions. Specifically, if two or more points (hereinafter referred to as "supporting points "a") for supporting the piezoelectric member 7 against the pressure F are provided between the piezoelectric member 7 and the pressurized member 6, a gap may be provided between the piezoelectric member 7 and the pressurized member 6.

Although the supporting points "a" of the piezoelectric member 7 are provided on the pressurized member 6, as long as the pressure F applied to the pressurized member 6 propagates to the piezoelectric member 7 through the supporting points "a", the pressurized member 6 and the piezoelectric member 7 need not be directly in contact with each other and a member for propagating the pressure F may be interposed between the pressurized member 6 and the piezoelectric member 7.

Here, when the pressure F is applied to the contact surface 6A, a displacement of the supporting point "a" of the piezoelectric member 7 with respect to a maximum displacement of the piezoelectric member 7, is preferably 10% or less. The supporting point "a" may be freely displaced in any direction other than the direction of the pressure F. For example, the supporting point "a" may be slid in a direction perpendicular to the pressurizing direction and in a parallel direction to the principal surface of the piezoelectric member 7.

In the pressure detecting device according to the present embodiment, when the pressurized member 6 and the piezoelectric member 7 are displaced by the pressure applied to the contact surface 6A, it is preferable to provide a gap for the displacement or a portion capable of absorbing the displacement. Specifically, it is preferable that the pressure detecting device according to this embodiment further has a relaxing portion that has a Young's modulus of 0.1 GPa or less and that is provided on an opposite side, from the pressurized member 6 side, of the piezoelectric member 7. In the pressure detecting device 10 shown in FIGS. 1 and 2, a void 11 as a relaxing portion is provided on a back surface of the piezoelectric member 7. Since the void 11 is provided, when pressure is applied to the contact surface 6A of the base material 6, the piezoelectric member 7 (in particular, the PLA film 4 included in the piezoelectric member 7) is displaced together with the base material 6 in accordance with the strength of the pressure, around a position where the pressure is applied as a center, whereby an electric charge can be generated. A buffer material as a relaxing portion may be provided on the back surface of the piezoelectric member 7.

—Pressurized Member—

A pressurized member (for example, the pressurized member 6) of the present embodiment has a contact surface (for example, the contact surface 6A) receiving pressure due to contact with a pressurizing means (for example, the pressurizing means 8) such as fingers of an operator.

Examples of the pressurizing means include not only fingers of an operator but also a member for pressurization, such as a pen-like member (for example, a touch pen) or a bar-like member.

The pressurized member in the present embodiment may be an inorganic material such as glass or an organic material (preferably resin) such as resin (such as acrylic resin and vinyl chloride resin), and the material of the pressurized member is not limited especially.

As the pressurized member, a pressurized member in which an inorganic material layer and an organic material layer are stacked and integrated, or a pressurized member in which an inorganic material is dispersed in a resin material layer, may be used.

When a touch panel is produced by overlapping the pressure detecting device of this embodiment on a viewing side of a display device, in order to enhance the visibility of the display device, it is preferable that a highly transparent material is used as a pressurized member.

The contact surface 6A is a surface undergoing contact with the pressurizing means 8 such as fingers of an operator. The contact surface 6A may be a surface of the pressurized member 6 formed as a single layer. Alternatively, the pressurized member 6 is formed of a plurality of materials, and the outermost layer may constitute the contact surface 6A. For example, an electrode may be arranged on the surface of the pressurized member 6, and a hard coat layer may be formed to enhance the scratch resistance. Alternatively, the inside of the pressurized member 6 may have a void in part.

In any configuration, when a product IEb of a cross-sectional secondary moment Ib and a Young's modulus Eb, as the entire pressurized member 6, is obtained, it is only required that a ratio IEb/IEa between the product IEb and a product IEa of a cross-sectional secondary moment Ia and a Young's modulus Ea of the piezoelectric member 7, is in a range of from $10^2$ to $10^{10}$. The preferred range of IEb/IEa is as described above.

From the viewpoint of reducing distortion of a detection signal, the thickness of the pressurized member 6 is preferably in a range of from 0.2 mm to 20 mm, more preferably from 0.3 mm to 10 mm.

From the viewpoint of efficiently transmitting a distortion that is generated by pressing, to a distortion of a piezoelectric member, the Young's modulus Eb of the pressurized member (for example, the pressurized member 6) in the present embodiment is preferably in a range of 200 GPa or less. The Young's modulus Eb of the pressurized member in this embodiment is preferably in a range of from 1 GPa to 200 GPa, particularly preferably from 3 GPa to 100 GPa.

From the viewpoint of more efficiently propagating pressure applied to a contact surface to a piezoelectric member, the cross-sectional secondary moment Ib of the pressurized member in the present embodiment is preferably from $10^{-1}$ $mm^4$ to $10^7$ $mm^4$, more preferably from $10^{-1}$ $mm^4$ to $10^6$ $mm^4$, still more preferably from $10^{-1}$ $mm^4$ to $10^5$ $mm^4$.

From the viewpoint of more efficiently propagating pressure applied to a contact surface to a piezoelectric member, IEb in this embodiment is preferably from 10 GPa·$mm^4$ to $10^8$ GPa·$mm^4$, more preferably from 10 GPa·$mm^4$ to $10^7$ GPa·$mm^4$, still more preferably from 10 GPa·$mm^4$ to $10^6$ GPa·$mm^4$, particularly preferably $10^2$ GPa·$mm^4$ to $10^5$ GPa·$mm^4$.

From the viewpoint of balance between generated charge density and strength, the Young's modulus Ea of a piezoelectric member (for example, the piezoelectric member 7) in the present embodiment is preferably in a range of from 1 GPa to 10 GPa, more preferably 1 GPa to 5 GPa, particularly preferably 2 GPa to 4 GPa.

From the viewpoint of balance between generated charge density and strength, the cross-sectional secondary moment Ia of the piezoelectric member in this embodiment is preferably from $10^{-7}$ $mm^4$ to $10^{-1}$ $mm^4$, more preferably from $10^{-6}$ $mm^4$ to $10^{-2}$ $mm^4$, particularly preferably from $10^{-5}$ $mm^4$ to $10^{-3}$ $mm^4$.

From the viewpoint of balance between generated charge density and strength, IEa in this embodiment is preferably from $10^{-6}$ GPa·$mm^4$ to 1 GPa·$mm^4$, more preferably from $10^{-5}$ GPa·$mm^4$ to $10^{-1}$ GPa·$mm^4$, particularly preferably from $10^{-4}$ GPa·$mm^4$ to $10^{-2}$ GPa·$mm^4$.

In the present embodiment, the pressurized member (the pressurized member 6 in FIG. 1) and the piezoelectric member (the piezoelectric member 7 in FIG. 1) may be adhered through the double-sided tape 1 and the first electrode layer 2 as shown in FIG. 1, or they may be arranged while a void (gap) is provided therebetween. If the void is provided between the pressurized member and the piezoelectric member, it is preferable that the size of the void in a direction in which pressure is applied is 0.1 mm or less. This is because when distortion (displacement) occurs in the pressurized member due to a pressurizing means (the pressurizing means 8 in FIG. 1) such as fingers, the pressurized member and the piezoelectric member are in contact with each other, whereby the distortion of the pressurized member propagates to the piezoelectric member, so that an electric charge is easily generated by the piezoelectric member (in particular, a polymeric piezoelectric material contained in the piezoelectric member).

—Piezoelectric Member—

A piezoelectric member (for example, the piezoelectric member 7) in the present embodiment is arranged facing a pressurized member (for example, the pressurized member 6) and contains a polymeric piezoelectric material (for example, the PLA film 4).

As the polymeric piezoelectric material in this embodiment, a polymeric piezoelectric material having a piezoelectric constant $d_{14}$ of 1 pm/V or more as measured by a displacement method at 25° C. may be used, for example.

[Piezoelectric Constant]

The term "piezoelectric constant $d_{14}$" refers to one of the piezoelectric modulus tensors, and determined from the degree of polarization that is generated in a direction in which a shearing stress is applied along the stretching axis direction of a stretched material. Specifically, the density of charges generated per unit shearing stress is defined as $d_{14}$. A higher value of the piezoelectric constant $d_{14}$ means that piezoelectricity is the higher. As used herein, the mere usage of the phase "piezoelectric constant" refers to "piezoelectric constant $d_{14}$".

In addition, a complex piezoelectric modulus $d_{14}$ is calculated as $d_{14}=d_{14}'-id_4''$, wherein $d_{14}'$ and $d_{14}''$ are obtained by Rheolograph-Solid, Model S-1 manufactured by Toyo Seiki Seisaku-sho, Ltd. $d_{14}'$ represents the real part of the complex piezoelectric modulus, $id_{14}''$ represents the imaginary part of the complex piezoelectric modulus, and $d_{14}'$ (real part of complex piezoelectric modulus) is equivalent to the piezoelectric constant $d_{14}$ in accordance with this embodiment.

In addition, a higher value of the real part of a complex piezoelectric modulus means that the piezoelectricity is the better.

There are a piezoelectric constant $d_{14}$ measured by a displacement method (unit: pm/V) and the same measured by a resonance method (unit: pC/N).

[Piezoelectric Constant (Displacement Method)]

In the present embodiment, the piezoelectric constant (displacement method) of a polymeric piezoelectric material refers to a value measured as follows by the displacement method, for example.

The polymeric piezoelectric material is cut into a size of 40 mm in a stretching direction (MD direction) and 40 mm in a direction perpendicular to the stretching direction (TD direction), thereby producing a rectangular test piece. Next, the resultant test piece is arranged on a test bench of SIP-600 manufactured by Showa Shinku Co., Ltd., and Al is deposited on one side of the test piece so that deposition thickness of Al is 50 nm. Subsequently, the other side of the test piece is similarly deposited with Al to coat the both sides of the test piece with Al, and, thus, to form an Al conductive layer.

The test piece having the Al conductive layer on the both sides and having a size of 40 mm×40 mm is cut into a size of 32 mm in a direction forming an angle of 45° with respect to the stretching direction (MD direction) of the polymeric piezoelectric material and 5 mm in a direction perpendicular to the direction forming an angle of 45°, thus forming a rectangular film having a size of 32 mm×5 mm. This film is used as a sample for piezoelectric constant measurement.

A difference distance between a maximal value and a minimum value of the displacement of the film, which occurred upon application of a sinusoidal alternating voltage of 10 Hz and 300 Vpp to the sample, is measured by a laser spectral-interference displacement meter SI-1000, manufactured by Keyence Corporation. The value obtained by dividing the measured displacement (mp-p) by the reference length of the film, which is 30 mm, is used as an amount of deformation, and a value obtained by multiplying a value, obtained by dividing the amount of deformation by an electric field intensity ((applied voltage (V))/(film thickness)) applied to the film, by 2, is used as the piezoelectric constant $d_{14}$.

The higher the piezoelectric constant is, the greater the displacement of the material with respect to a voltage applied to the polymeric piezoelectric material is, or conversely, the greater the voltage generated with respect to a force applied to the polymeric piezoelectric material is, which is advantageous as a polymeric piezoelectric material. Specifically, the piezoelectric constant $d_{14}$ as measured by a displacement method at 25° C. is usually 1 pm/V or more, preferably 4 pm/V or more, more preferably 6 pm/V or more, particularly preferably 8 pm/V or more. The upper limit of the piezoelectric constant $d_{14}$ is not limited especially, but is preferably 50 pm/V or less, and may be more preferably 30 pm/V or less, in the case of a piezoelectric material employing a helical chiral polymer, from the viewpoint of balance with transparency as described below and so on.

In the present embodiment, it is preferable that a direction in which pressure is applied from the contact surface (for example, a direction 20 in FIG. 1) and a molecular orientation direction (for example, a molecular orientation direction 9 in FIG. 2) of the polymeric piezoelectric material (for example, the PLA film 4 in FIG. 1) cross each other.

Since the direction in which pressure is applied from the contact surface and the molecular orientation direction of the polymeric piezoelectric material cross each other, a pressurized member is flexed when receiving the pressure applied in the thickness direction of the piezoelectric member through the contact surface of the pressurized member, which resulted in applying a tensile force to the piezoelectric member, and thus, to deform the piezoelectric member, whereby an electric charge is easily generated in the polymeric piezoelectric material.

The polymeric piezoelectric material according to the present embodiment preferably contains a helical chiral polymer (hereinafter suitably referred to as an "optically active polymer (A)") having a weight average molecular weight of from 50,000 to 1,000,000 and having optical activity, and has crystallinity as obtained by a DSC method of from 20% to 80%, and a product of a standardized molecular orientation MORc, which is measured with a microwave transmission-type molecular orientation meter at a reference thickness of 50 μm, and the crystallinity is from 40 to 700.

The helical chiral polymer having optical activity (hereinafter also referred to as an "optically active polymer") refers to a polymer having a helical molecular structure and having molecular optical activity.

Examples of helical chiral polymers having optical activity include polypeptides, cellulose derivatives, polylactic acid-based resins, polypropylene oxides, and poly(β-hydroxybutyrate).

Examples of the polypeptides include poly(γ-benzyl glutarate), and poly(γ-methyl glutarate).

Examples of the cellulose derivatives include cellulose acetate and cyanoethyl cellulose.

In the optically active polymer (A) in the present embodiment, the optical purity is preferably 95.00% ee or more, more preferably 96.00% ee or more, still more preferably 99.00% ee or more, and further more preferably 99.99% ee or more, from the viewpoint of improving the piezoelectricity of the polymeric piezoelectric material. The optical purity is desirably 100.00% ee. It is considered that by adjusting the optical purity of the optically active polymer to be in the range mentioned above, a packing property of polymer crystals that demonstrate piezoelectricity is increased, whereby the piezoelectricity is increased.

In the present embodiment, the optical purity of the optically active polymer is a value calculated by the following equation.

$$\text{Optical purity (\% } ee\text{)}=100\times|L \text{ isomer amount}-D \text{ isomer amount}|/(L \text{ isomer amount}+D \text{ isomer amount})$$

More specifically, a value of "the difference (absolute value) between L-form amount [% by mass] of the optically active polymer and D-form amount [% by mass] of the optically active polymer (A)" divided by "the total of L-form amount [% by mass] of the optically active polymer and D-form amount [mass %] of the optically active polymer" multiplied by "100" is defined as optical purity.

For the L isomer amount [% by mass] of the optically active polymer and the D isomer amount [% by mass] of the optically active polymer, values obtained by a method using high performance liquid chromatography (HPLC) are used.

Among the optically active polymers (A) described above, a compound including a main chain that contains a repeating unit represented by the following Formula (1) is preferable from the viewpoint of increasing the optical purity and improving the piezoelectricity.

(1)

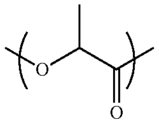

Examples of the compound containing the repeating unit, as a main chain, represented by the Formula (1) include polylactic acid-based polymers. In particular, polylactic acid is preferred, and a homopolymer of L-lactic acid (PLLA) or a homopolymer of D-lactic acid (PDLA) is most preferred. The polylactic acid-based polymer in the present embodiment refers to "polylactic acid (a polymer compound which is only constituted by any repeating unit derived from monomer(s) selected from the group consisting of L-lactic acid and D-lactic acid)", "copolymer of at least one of L-lactic acid or D-lactic acid and a compound polymerizable with the L-lactic acid or the D-lactic acid", or a mixture thereof.

Polylactic acid is a polymer having a long chain structure formed by polymerization of lactic acid via ester bonding, and it is known that polylactic acid can be produced by a lactide method in which lactide is produced as an intermediate, a direct polymerization method including heating lactic acid in a solvent under a reduced pressure, and polymerizing the same while removing water, or the like. Examples of the polylactic acid include a homopolymer of L-lactic acid, a homopolymer of D-lactic acid, a block copolymer containing a polymer of at least one of L-lactic acid or D-lactic acid, and a graft copolymer containing a polymer of at least one of L-lactic acid or D-lactic acid.

Examples of the "compound polymerizable with the L-lactic acid or the D-lactic acid" include hydroxycarboxylic acid, such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethyl caproic acid, and mandelic acid; cyclic ester, such as glycolide, β-methyl-δ-valerolactone, γ-valerolactone, and ε-caprolactone; polyvalent carboxylic acid, such as oxalic acid, malonic acid, succinic acid, glutaric acid, adipic acid, pimelic acid, azelaic acid, sebacic acid, undecanedioic acid, dodecanedioic acid, and terephthalic acid, and anhydrides thereof; polyhydric alcohol, such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentylglycol, tetramethyleneglycol, and 1,4-hexanedimethanol; polysaccharide, such as cellulose; and aminocarboxylic acid, such as α-amino acid.

Examples of the "copolymer of at least one of L-lactic acid or D-lactic acid and a compound polymerizable with the L-lactic acid or the D-lactic acid" include a block copolymer or a graft copolymer having a polylactic acid sequence capable of generating a spiral crystal.

The concentration of a structure derived from a copolymer component in the optically active polymer (A) is preferably 20 mol % or less. For example, if the optically active polymer (A) is a polylactic acid-based polymer, the copolymer component is preferably 20 mol % or less to the total of the number of moles of a structure derived from lactic acid in the polylactic acid-based polymer and a structure derived from a compound (copolymer component) capable of being copolymerized with lactic acid.

The polylactic acid resin can be manufactured by, for example, a method disclosed in JP-A No. 59-096123 or 7-033861 in which a polylactic acid resin is obtained by performing direct dehydration condensation of lactic acid; a method disclosed in U.S. Pat. No. 2,668,182, U.S. Pat. No 4,057,357, etc. in which ring opening polymerization is performed using lactide which is a cyclic dimer of lactic acid.

In order that the optically active polymer obtained by the manufacturing methods described above has an optical purity of 95.00% ee or more, when polylactic acid is produced by a lactide method, for example, it is preferable to polymerize lactide whose optical purity has been increased to an optical purity of 95.00% ee or more by crystallization operation.

The content of the optically active polymer (A) in the polymeric piezoelectric material in the present embodiment is preferably 80% by mass or more.

[Weight Average Molecular Weight of Optically Active Polymer (A)]

The weight average molecular weight (Mw) of the optically active polymer (A) according to the present embodiment is from 50,000 to 1,000,000. When the lower limit of the weight average molecular weight of the optically active polymer is 50,000 or more, the mechanical strength of an article formed from the optically active polymer may be sufficient. The lower limit of the weight average molecular weight of the optically active polymer is preferably 100,000 or more, and more preferably 200,000 or more. On the other hand, when the upper limit of the weight average molecular weight of the optically active polymer (A) is 1,000,000 or less, molding, such as extrusion molding, of an article such as a film formed from the optically active polymer may be easy to perform. The upper limit of the weight average molecular weight is preferably 800,000 or less, and more preferably 300,000 or less.

The molecular weight distribution (Mw/Mn) of the optically active polymer (A) is preferably from 1.1 to 5, and more preferably from 1.2 to 4, from the viewpoint of the strength of a polymeric piezoelectric material. The molecular weight distribution is further preferably from 1.4 to 3.

Meanwhile, the weight average molecular weight (Mw) and the molecular weight distribution (Mw/Mn) of the polylactic acid polymer (A) are measured by the following GPC measurement method by using gel permeation chromatograph (GPC).

—GPC Measurement Device—

GPC-100, manufactured by Waters

—Column—

SHODEX LF-804, manufactured by Showa Denko K.K

—Preparation of Sample—

Polylactic acid polymer (A) is dissolved in a solvent (for example, chloroform) at 40° C., thereby preparing a sample solution with a concentration of 1 mg/ml.

—Measurement Conditions—

0.1 ml of the sample solution was introduced into a column with a solvent (chloroform) at a temperature of 40° C. at a flow rate of 1 ml/min.

The sample concentration in the sample solution separated in the column is measured with a differential refractometer. A universal calibration curve with a polystyrene standard sample is created to calculate the weight average molecular weight (Mw) and the molecular weight distribution (Mw/Mn) of the polylactic acid polymer (A).

As a polylactic acid polymer, commercially available polylactic acid may be used and examples include PURASORB (PD and PL) manufactured by PURAC, and LACEA (H-100 and H-400), manufactured by Mitsui Chemicals, Inc.

When a polylactic acid resin is used as the optically active polymer, it is preferable to produce the optically active polymer by a lactide method or a direct polymerization method in order to obtain a polylactic acid resin having a weight average molecular weight (Mw) of 50,000 or more.

[Stabilizer (B)]

It is preferable that the polymeric piezoelectric material in the present embodiment contains, as a stabilizer, a compound having one or more functional groups selected from the group consisting of a carbodiimide group, an epoxy group, and an isocyanate group and having a weight average molecular weight of from 200 to 60,000.

The stabilizer (B) is used to suppress the hydrolysis reaction of the helical chiral polymer (it is estimated that this hydrolysis reaction proceeds in accordance with the following, for example) and improve moist heat resistance of a resultant piezoelectric material.

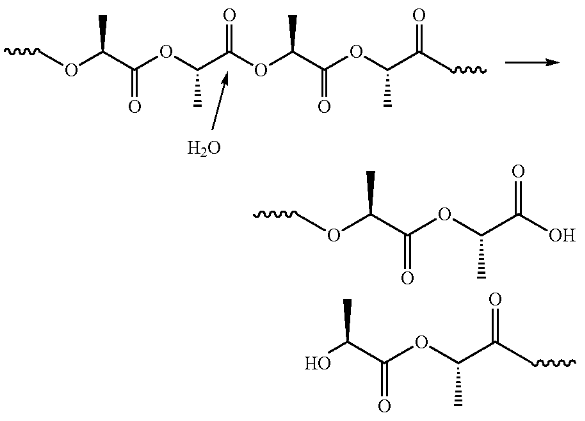

Examples of a functional group capable of interacting with both a hydroxyl group and a carboxy group in order to suppress the hydrolysis reaction of the helical chiral polymer include at least one functional group selected from the group consisting of a carbodiimide group, an isocyanate group, and an epoxy group, and among them, the carbodiimide group is preferred from the viewpoint of effects.

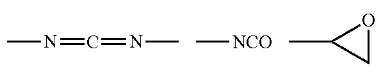

The weight average molecular weight of the stabilizer (B) used in the present embodiment is preferably 200 to 60,000, more preferably 200 to 30,000, still more preferably 300 to 18,000. If the molecular weight is in the above range, the movement of the stabilizer (B) is facilitated, and it is assumed that sufficient moist heat resistance improvement effect can be obtained.

The stabilizer (B) may be used alone or used in a combination of two or more. A preferred embodiment of the stabilizer (B) includes a combination of: a stabilizer (B1) that has one or more functional groups selected from the group consisting of a carbodiimide group, an epoxy group, and an isocyanate group, and that has a number average molecular weight of 200 to 900; and a stabilizer (B2) that has, in one molecule, two or more functional groups of one or more types selected from the group consisting of a carbodiimide group, an epoxy group, and an isocyanate group, and that has a number average molecular weight of 1,000 to 60,000. The weight average molecular weight of the stabilizer (B1) having a number average molecular weight of 200 to 900 is about 200 to 900, so that the number average molecular weight and the weight average molecular weight of the stabilizer (B1) are substantially the same values.

Specific examples of the stabilizer (B1) include dicyclohexylcarbodiimide, bis-2,6-diisopropylphenylcarbodiimide, hexyl isocyanate, octadecyl isocyanate, 3-(triethoxysilyl) propyl isocyanate, N-glycidyl phthalimide, ortho-phenylphenyl glycidyl ether, phenyl glycidyl ether, and p-t-butylphenyl glycidyl ether.

Specific examples of the stabilizer (B2) include poly(4,4'-dicyclohexylmethane carbodiimide), poly(tetramethylxylylene carbodiimide), poly(N,N-dimethylphenylcarbodiimide), poly(N,N'-di-2,6-diisopropylphenylcarbodiimide), a diphenylmethane diisocyanate-type polyisocyanate, a 1,6-hexamethylene diisocyanate-type polyisocyanate, a xylylene diisocyanate-type polyisocyanate, an isophorone diisocyanate-type polyisocyanate, a phenol novolac-type epoxy resin, a cresol novolac-type epoxy resin, and epoxidized polybutadiene.

The stabilizer (B1) having a relatively small molecular weight and the stabilizer (B2) having multiple functions and a relatively large molecular weight are contained, thereby the moist heat resistance is improved particularly. Considering balance between both additive amounts, it is preferable to contain a large amount of the stabilizer (B1) having a single function and a relatively small molecular weight from the viewpoint of improving transparency, it is preferable that the stabilizer (B2) is in a range of from 10 parts by mass to 150 parts by mass based on 100 parts by mass of the stabilizer (B1) from the viewpoint of simultaneously achieving the transparency and the moist heat resistance, and it is more preferable that the stabilizer (B2) is in a range of from 50 parts by mass to 100 parts by mass.

As another preferred embodiment, it is preferable that the stabilizer (B) contains a stabilizer (B3) having, in one molecule, one functional group selected from the group consisting of a carbodiimide group, an epoxy group, and an isocyanate group, from the viewpoint of capable of improving dimensional stability. Since the stabilizer (B3) has, in one molecule, only one functional group selected from the group consisting of a carbodiimide group, an epoxy group, and an isocyanate group, the sites of the optically active polymer (A), which have hydroxyl groups or carboxy groups generated by hydrolysis become less likely to be cross-linked with the stabilizer (B3) in such a manner that the sites sandwich the stabilizer (B3). Thus, it is assumed that molecular chains of the optically active polymer (A) are suitably flexibly displaced to disperse internal stress of the polymeric piezoelectric material, and thus, to improve the dimensional stability of the polymeric piezoelectric material.

The weight average molecular weight of a compound having, in one molecule, one functional group selected from the group consisting of a carbodiimide group, an epoxy group, and an isocyanate group is preferably 200 to 2,000, more preferably 200 to 1500, still more preferably 300 to 900.

Specific examples of a compound having, in one molecule, one functional group selected from the group consisting of a carbodiimide group, an epoxy group, and an isocyanate group include dicyclohexylcarbodiimide, bis-2,6-diisopropylphenylcarbodiimide, hexyl isocyanate, octadecyl isocyanate, 3-(triethoxysilyl)propyl isocyanate, N-glycidylphthalimide, ortho-phenylphenyl glycidyl ether, phenyl glycidyl ether, and p-t-butylphenyl glycidyl ether. Among them, dicyclohexylcarbodiimide and bis-2,6-diisopropylphenylcarbodiimide are preferable, and bis-2,6-diisopropylphenylcarbodiimide is more preferable.

The stabilizer (B3) may be used in combination with a stabilizer (B4) having, in one molecule, two or more functional groups selected from the group consisting of a carbodiimide group, an epoxy group, and an isocyanate group (for example, the stabilizer (B2) is included). It is preferable that the amount of the stabilizer (B4) having, in one molecule, two or more functional groups selected from the group consisting of a carbodiimide group, an epoxy group, and an isocyanate group, is in a range of from 5 parts by mass to 200 parts by mass based on 100 parts by mass of the stabilizer (B3), from the viewpoint of balance among transparency, moist heat resistance, and dimensional stability, and it is more preferable that the stabilizer (B4) is in a range of from 10 parts by mass to 100 parts by mass.

[Weight Average Molecular Weight and Number Average Molecular Weight of Stabilizer (B)]

The number average molecular weight (Mn) and the weight average molecular weight (Mw) of the stabilizer (B) are similarly measured by the measuring method using a gel permeation chromatograph (GPC), as described in the section of the optically active polymer (A). In addition to GPC, they can be measured by another measuring method such as GC-MS, FAB-MS, ESI-MS, and TOF-MS.

It is preferable that the additive amount of the stabilizer (B) is from 0.01 part by mass to 10 parts by mass based on 100 parts by mass of the optically active polymer (A). In order to obtain higher reliability (specifically the reliability for 500 hours of a reliability test described below), the additive amount is more preferably 0.7 part by mass or more. In particular, if an aliphatic carbodiimide is used as a stabilizer, it is more preferable that stabilizer (B) is contained in an amount of from 0.01 part by mass to 2.8 parts by mass from the viewpoint of transparency. If the additive amount is in the above range, the reliability of a piezoelectric material can be enhanced without significantly impairing an internal haze of a polymeric piezoelectric material in the present embodiment.

If two or more of the stabilizers (B) are used in combination, the additive amount indicates the total amount of the stabilizers (B).

Meanwhile, from the viewpoint of lowering the internal haze and increasing or maintaining the piezoelectric constant, the additive amount of the stabilizer (B) is preferably from 0.01 part by mass to 1.2 parts by mass, more preferably from 0.01 part by mass to 0.7 part by mass, still more preferably from 0.01 part by mass to 0.6 part by mass, based on 100 parts by mass of the optically active polymer (A) having optical activity.

[Other Components]

The polymeric piezoelectric material of the present embodiment may contain other components, such as a known resin represented by polyvinylidene fluoride, polyethylene resin or polystyrene resin, inorganic fillers, such as silica, hydroxyapatite or montmorillonite, known crystal nucleating agents, such as phthalocyanine, insofar as the advantageous effect of the present embodiment is not impaired.

—Inorganic Fillers—

For example, in order to form a polymeric piezoelectric material into a transparent film in which generation of voids, such as bubbles, is suppressed, inorganic fillers, such as hydroxy apatite, may be nano-dispersed into the polymeric piezoelectric material. However, in order to allow an inorganic filler to be nano-dispersed, a large amount of energy is required for crushing aggregates. On the other hand, when the filler is not nano-dispersed, transparency of the film may decrease in some cases. When the polymeric piezoelectric material according to the present embodiment contains an inorganic filler, the content thereof with respect to the total mass of the polymeric piezoelectric material is preferably lower than 1% by mass.

In addition, when the polymeric piezoelectric material contains a component other than the helical chiral polymer, the content thereof other than the helical chiral polymer is preferably 20% by mass or lower, and more preferably 10% by mass or lower, with respect to the total mass of the polymeric piezoelectric material.

—Crystallization Accelerator (Crystal Nucleating Agent)—

For a crystallization accelerator which is not particularly limited insofar as a crystal accelerating effect can be recognized, it is preferable to select a substance with the crystal structure having lattice spacing close to the lattice spacing of the crystal lattice of the helical chiral polymer. This is because a substance having closer lattice spacing has the higher activity as a nucleating agent. For example, if a polylactic acid-type polymer is used as a helical chiral polymer, examples include an organic substance, such as zinc phenylsulfonate, melamine polyphosphate, melamine cyanurate, zinc phenylphosphonate, calcium phenylphosphonate, and magnesium phenylphosphonate, and an inorganic substance, such as talc and clay. Among others, zinc phenylphosphonate, which has lattice spacing closest to the lattice spacing of polylactic acid and exhibits excellent crystallization accelerating activity, is preferable. Meanwhile, a commercial product can be used as a crystallization accelerator. Specific examples thereof include ECOPROMOTE (zinc phenylphosphonate: by Nissan Chemical Ind., Ltd.).

The content of a crystal nucleating agent with respect to 100 parts by mass of a helical chiral polymer (for example, the optically active polymer (A)) is normally from 0.01 part by mass to 1.0 part by mass, preferably from 0.01 part by mass to 0.5 part by mass, and from a viewpoint of better crystallization accelerating activity and maintenance of a biomass ratio especially preferably from 0.02 part by mass to 0.2 part by mass. If the content of a crystal nucleating agent is less than 0.01 part by mass, the crystallization accelerating activity is not sufficient, and if it exceeds 1.0 part by mass, it becomes difficult to regulate the crystallization rate and the transparency of a polymeric piezoelectric material tends to decline.

The polymeric piezoelectric material preferably contains no components other than the optically active polymer (A) and the stabilizer (B) from the viewpoint of transparency.

[Other Physical Properties]

In a polymeric piezoelectric material of the present embodiment, molecules are highly orientated. Molecular orientation ratio MOR is used as an index representing the orientation. Namely, the molecular orientation ratio (MOR) is a value indicating the degree of molecular orientation, and measured by the following microwave measurement method. Namely, a sample (film) is placed in a microwave resonant waveguide of a well known microwave molecular orientation ratio measuring apparatus (also referred to as a "microwave transmission-type molecular orientation meter") such that the sample plane (film plane) is arranged perpendicular to the travelling direction of the microwaves. Then, the sample is continuously irradiated with microwaves whose oscillating direction is biased unidirectionally, while maintaining such conditions, the sample is rotated in a plane perpendicular to the travelling direction of the microwaves from 0 to 360°, and the intensity of the microwaves passed through the sample is measured to determine the molecular orientation ratio MOR.polymeric piezoelectric material Standardized molecular orientation MORc in the present embodiment means a MOR value to be obtained at the reference thickness tc of 50 μm, and can be determined by the following formula.

$$MORc=(tc/t)\times(MOR-1)+1$$

(tc: Reference thickness corrected to; t: Sample thickness)

A standardized molecular orientation MORc can be measured by a publicly known molecular orientation meter, e.g. a microwave-type molecular orientation analyzer MOA-2012A or MOA-6000 by Oji Scientific Instruments, at a resonance frequency in the vicinity of 4 GHz or 12 GHz.

The standardized molecular orientation MORc can be regulated as described below mainly by the heat treatment conditions (heating temperature and heating time) before stretching a uniaxially-stretched film, and the stretching conditions (stretching temperature and stretching speed).

Standardized molecular orientation MORc can be converted to birefringence Δn, which equals to retardation divided by film thickness. More specifically, the retardation can be measured by RETS 100, by Otsuka Electronics Co., Ltd. Further, MORc and Δn are approximately in a linearly proportional relationship, and if Δn is 0, MORc is 1.

For example, if the optically active polymer (A) is a polylactic acid-type polymer and the birefringence Δn is measured at measurement wavelength of 550 nm, the lower limit 2.0 of a preferable range for the standardized molecular orientation MORc can be converted to the birefringence Δn of 0.005. Further, the lower limit 40 of a preferable range of the product of the standardized molecular orientation MORc multiplied by the crystallinity of a polymeric piezoelectric material can be converted to 0.1 as the product of the birefringence Δn and the crystallinity of an polymeric piezoelectric material.

[Standardized Molecular Orientation MORc]

The polymeric piezoelectric material in the present embodiment preferably has a standardized molecular orientation MORc of from 3.5 to 15.0, more preferably from 4.0 to 15.0, still more preferably from 6.0 to 10.0, and further more preferably from 7 to 10.0. If the standardized molecular orientation MORc is in the range of from 3.5 to 15.0, more polylactic acid molecular chains are arranged in a stretching direction, whereby a rate of generation of oriented crystals can be increased and high piezoelectricity can be achieved.

[Crystallinity]

The crystallinity of the polymeric piezoelectric material is determined by the DSC method, and the crystallinity of the polymeric piezoelectric material in accordance with this embodiment is from 20% to 80%, preferably from 25% to 70%, and more preferably from 30% to 50%. If the crystallinity is in the range, a balance between the piezoelectric characteristic and transparency of the polymeric piezoelectric material is good, and the occurrence of whitening and breaking is inhibited to facilitate its production when the polymeric piezoelectric material is stretched.

[Product of Standardized Molecular Orientation MORc and Crystallinity]

The product of the crystallinity and the standardized molecular orientation MORc of the polymeric piezoelectric material is preferably from 40 to 700, more preferably from 75 to 680, still more preferably from 90 to 660, even more preferably from 125 to 650, further preferably from 180 to 350. If the product of the crystallinity and the standardized molecular orientation MORc of the polymeric piezoelectric material is in the range of from 40 to 700, a balance between the piezoelectric characteristic and transparency of the polymeric piezoelectric material is good, and the dimensional stability is high, whereby the polymeric piezoelectric material can be suitably used as a piezoelectric element as described later.

[Transparency (Internal Haze)]

The transparency of the polymeric piezoelectric material may be evaluated, for example, by visual observation or haze measurement. In the haze of the polymeric piezoelectric material in the present embodiment, the transmission haze for visible light rays is preferably 10% or less, more preferably 5% or less, and still more preferably 1% or less. As used herein, the haze is a value obtained by measurement in the polymeric piezoelectric material with a thickness of 0.05 mm at 25° C. using a haze measuring machine [manufactured by Tokyo Denshoku Co., Ltd.; TC-HIII DPK] in conformity with JIS-K7105. The haze of the polymeric piezoelectric material, which is preferably lower, is preferably from 0.01% to 10%, more preferably from 0.1% to 5%, and particularly preferably from 0.1% to 1%, from the viewpoint of a balance with the piezoelectric constant and the like. Ad used herein, "haze" or "internal haze" refers to the internal haze of the polymeric piezoelectric material. The internal haze is a haze excluding a haze due to the shape of the external surface of the polymeric piezoelectric material.

<Process for Producing Polymeric Piezoelectric Material>

Source materials of a polymeric piezoelectric material in the present embodiment can be obtained by mixing the optically active polymer (A) such as the already-described polylactic acid-based polymer and, according to need, other components such as the stabilizer (B) such as a carbodiimide compound to produce a mixture. The mixture may be melt-kneaded. Specifically, the optically active polymer (A) to be mixed and other components to be used according to need are melt-kneaded under conditions of a mixer revolution rate of from 30 rpm to 70 rpm and a temperature of from 180° C. to 250° C. for from 5 min to 20 min, using a melt-kneading machine (Labo Plastomill manufactured by Toyo Seiki Seisaku-Sho, Ltd.), thereby obtaining a blend of the optically active polymer (A) and the stabilizer (B), a blend of plural kinds of helical chiral polymers, a blend of a helical chiral polymer with other components such as an inorganic filler, or the like.

The polymeric piezoelectric material in the present embodiment may be produced by a production process including a first process for crystallizing a sheet which is in an amorphous state and containing the optically active polymer (A) and, according to need, the stabilizer (B) to obtain a preliminarily crystallized sheet (also referred to as a crystallized original sheet) and a second process for stretching the preliminarily crystallized sheet mainly in a uniaxial direction.

Generally, as a force applied to a film during stretching is increased, orientation of the helical chiral polymer is promoted and a piezoelectric constant is increased, whereby crystallization is promoted and the crystal size is increased. As a result, the degree of haze tends to be increased. Also, a dimension deformation rate tends to increase due to an increase in internal stress. When a force is simply applied to the film, crystals that are not oriented, such as spherulites, are formed. Crystals with low orientation, such as spherulites, are less likely to contribute to an increase in the piezoelectric constant, while increasing the haze. Therefore, in order to form a film that is high in piezoelectric constant but low in haze and dimension deformation rate, it is necessary to form, with high efficiency, oriented crystals that contribute to an increase in the piezoelectric constant and that have a size that is small enough not to increase the haze.

In the process for producing the polymeric piezoelectric material in the present embodiment, for example, prior to be stretched, inside of the sheet is subjected to preliminary crystallization to form fine crystals, and then the sheet is stretched. In this way, a force that is applied to the film at the time of stretching can be efficiently applied to a polymer portion among fine crystals, in which crystallinity is low, whereby helical chiral polymers can be efficiently oriented in a main stretching direction. More specifically, while oriented fine crystals are generated in a polymer portion among fine crystals having low crystallinity, spherulites that have been generated during the preliminary crystallization are broken, and lamella crystals that form the spherulites are oriented in a stretching direction in the form of beads linked to tie molecular chains, whereby a desired value of MORc can be obtained. As a result, a sheet that is low in haze and dimension deformation rate can be obtained without greatly decreasing the piezoelectric constant.

In order to control the standardized molecular orientation MORc, it is important to regulate crystallinity of a crystallized original sheet according to the time and the temperature for the heat treatment in the first process and so on, and to regulate the rate and the temperature of stretching in the second process. As described above, the helical chiral polymer is a polymer that has optical activity. The sheet that is in an amorphous state and contains the helical chiral polymer and a CARBODILITE compound may be commercially obtained or may be prepared by a known film-molding means, such as extrusion molding. The sheet in an amorphous state may be single or multi-layered.

[First Process (Preliminarily Crystallization Process)]

A preliminarily crystallized sheet can be obtained by heat-treating and crystallizing a sheet in an amorphous state containing the optically active polymer (A) and, according to need, the stabilizer (B). Alternatively, source materials containing the optically active polymer (A) and the stabilizer (B) may be heated to a temperature higher than the glass transition temperature of the helical chiral polymer, and extruded to a sheet form by, for example, an extrusion molding method, and the extruded sheet is then rapidly cooled at a caster thereby obtaining a preliminarily crystallized sheet having a predetermined crystallinity.

Further, 1) a preliminarily crystallized sheet, which is crystallized in advance, may be sent to a stretching process (second process) as described below to be arranged on a stretching apparatus and stretched (off-line heat treatment); or 2) a sheet in an amorphous state, not yet crystallized by heat treatment, may be arranged on a stretching apparatus to be heated by the stretching apparatus for preliminary crystallization, and to be sent continuously to a stretching process (second process), whereby the sheet may be stretched (in-line heat treatment).

Although there is no particular restriction on a heating temperature T for preliminary crystallizing a sheet that is in an amorphous state and containing a helical chiral polymer, from the viewpoint of enhancing the piezoelectricity, the transparency, etc. of a polymeric piezoelectric material produced by the production process, the temperature should be preferably set to satisfy the following relational equation with respect to the glass transition temperature Tg of the helical chiral polymer, so that the crystallinity is set from 3% to 70%.

$$Tg-40^\circ\text{ C.}\leq T\leq Tg+40^\circ\text{ C.}$$

(Tg represents the glass transition temperature of the helical chiral polymer.)

The heating time for preliminary crystallization or the heating time for crystallization on the occasion of extrusion into a sheet form may be so adjusted that the desired crystallinity is attained and the product of the standardized molecular orientation MORc of a polymeric piezoelectric material after stretching (second process) and the crystallinity of the polymeric piezoelectric material after stretching preferably falls within from 40 to 700, more preferably within from 125 to 650, and still more preferably within from 250 to 350. If the heating time is prolonged, the crystallinity after stretching is increased and the standardized molecular orientation MORc after stretching is also increased. If the heating time is reduced, the crystallinity after stretching is decreased and the standardized molecular orientation MORc after stretching also tends to be decreased.

If the crystallinity of a preliminarily crystallized sheet before stretching becomes high, the sheet becomes stiff and a larger stretching stress is exerted on the sheet, and therefore such parts of the sheet, where the crystallinity is relatively low, are also orientated highly to enhance also the standardized molecular orientation MORc after stretching. Reversely, conceivably, if the crystallinity of the preliminarily crystallized sheet before stretching becomes low, the sheet becomes soft and a stretching stress is exerted to a lesser extent on the sheet, and therefore such parts of the sheet, where the crystallinity is relatively low, are also orientated weakly to lower also the standardized molecular orientation MORc after stretching.

The heating time may vary depending on the heating temperature, the thickness of a sheet, the molecular weight of a resin that forms the sheet, and the type or the amount of an additive or the like. In addition, when preheating is carried out prior to the stretching process (second process) as described below at a temperature at which an amorphous sheet is crystallized, the heating time in which the sheet is substantially crystallized corresponds to the total of the preheating time and the heating time in the preliminary crystallization process that is carried out prior to the preheating.

The heating time for a sheet in an amorphous state or the heating time for crystallization in extruding into a sheet form is usually from 5 seconds to 60 minutes, and from the viewpoint of stabilizing the production conditions, it may be from 1 minute to 30 minutes. For example, when a sheet in an amorphous state containing a polylactic acid-based polymer as a helical chiral polymer is subjected to preliminary crystallization, the heating is preferably performed at from 20° C. to 170° C. for 5 seconds to 60 minutes, which may be from 1 minute to 30 minutes.

For imparting efficiently piezoelectricity, transparency, and high dimensional stability to a sheet after stretching, it is important to adjust the crystallinity of the preliminarily crystallized sheet prior to stretching the same. The reason why the piezoelectricity and the dimensional stability are improved by stretching is considered that a stress by stretching is concentrated on parts of the preliminarily crystallized sheet where the crystallinity, presumably in a state of spherocrystal, is relatively high, so that spherocrystal are destroyed and aligned to enhance the piezoelectricity $d_{14}$, and at the same time the stretching stress is exerted through the spherocrystals on parts where the crystallinity is relatively low, promoting orientation to enhance the piezoelectricity $d_{14}$.

The crystallinity of a sheet after stretching, or, if an annealing treatment described below is conducted, the crystallinity after the annealing treatment is set to from 20% to 80%, preferably from 40% to 70%. Consequently, the crystallinity of a preliminarily crystallized sheet immediately before stretching is set to from 3% to 70%, preferably from 10% to 60%, and more preferably from 15% to 50%.

The crystallinity of the preliminarily crystallized sheet can be measured in a similar manner to the measurement of the crystallinity of the polymeric piezoelectric material in the present embodiment after the stretching.

The thickness of the preliminarily crystallized sheet is selected mainly according to an intended thickness of a polymeric piezoelectric material by means of stretching at the second process and the stretching ratio, and is preferably from 50 μm to 1000 μm, and more preferably about from 200 μm to 800 μm.

[Second Process (Stretching Process)]

The method of stretching in the stretching process, which corresponds to the second process, is not particularly limited, and various stretching methods such as uniaxial stretching, biaxial stretching, and solid-phase stretching as described later may be used. By stretching a polymeric piezoelectric material, a polymeric piezoelectric material having a large principal plane can be obtained.

In this regard, a "principal plane" means, among surfaces of a polymeric piezoelectric material, a plane with the largest area. The polymeric piezoelectric material in the present embodiment may have two or more principal planes. For example, if a polymeric piezoelectric material has a plate-like shape with two rectangular planes A of 10 mm×0.3 mm, two rectangular planes B of 3 mm×0.3 mm, and two rectangular planes C of 10 mm×3 mm, the principal plane of the polymeric piezoelectric material is planes C, and there are two principal planes.

In the present embodiment, a principal plane having a large area refers to a principal plane having an area of 5 $mm^2$ or more. It is preferable that the area of the principal plane is 10 $mm^2$ or more.

It is presumed that molecular chains of a polylactic acid-based polymer contained in the polymeric piezoelectric material can be orientated uniaxially and aligned densely to attain higher piezoelectricity, if the polymeric piezoelectric material is stretched mainly uniaxially.

Here, the glass transition temperature Tg [° C.] of the polymeric piezoelectric material and the melting point Tm [° C.] of the polymeric piezoelectric material are respectively a glass transition temperature (Tg) obtained as a inflection point of a curve and a temperature (Tm) recognized as a peak value of an endothermic reaction, from a melting endothermic curve obtained for the polymeric piezoelectric material using a differential scanning calorimeter (DSC) by raising the temperature under a condition of the temperature increase rate of 10° C./min.

If the polymeric piezoelectric material is stretched solely by a tensile force as in the cases of a uniaxial stretching process or a biaxial stretching process, the stretching temperature of the polymeric piezoelectric material is preferably in a range of from 10° C. to 20° C. higher than the glass transition temperature of the polymeric piezoelectric material.

The stretching ratio during stretching is preferably from 3 times to 30 times, more preferably from 4 times to 15 times.

When the preliminarily crystallized sheet is stretched, preheating may be performed immediately prior to performing stretching so that the sheet can be easily stretched. Since the preheating is performed generally for the purpose of softening the sheet prior to stretching to facilitate the stretching, the same is normally performed avoiding conditions that promote crystallization of a sheet before stretching and make the sheet stiff. Meanwhile, as described above, in some cases according to the present embodiment, preliminary crystallization is performed prior to the stretching, as described above. Therefore, the preheating may be performed also as a process for preliminary crystallization. Specifically, the preheating can be combined with the preliminary crystallization by carrying out the preheating at a higher temperature for a longer time than a temperature and a time that are ordinarily employed in the preheating process, in order to conform to the heating temperature and the heating time in the preliminary crystallization.

[Annealing Treatment Process]

From the viewpoint of improving the piezoelectric constant, it is preferred to subject a polymeric piezoelectric material that has been stretched (subjected to the second process) to a heat treatment (hereinafter also referred to as an "annealing treatment"). In this connection, if crystallization is attained mainly by an annealing treatment, preliminary crystallization to be conducted in the above-described preliminary crystallization process may be sometimes omitted.

The temperature of the annealing treatment is preferably about from 80° C. to 160° C., more preferably from 100° C. to 155° C.

The method of temperature application in the annealing treatment is not particularly limited, and examples thereof include direct heating with a hot blast heater or an infrared heater and immersing the polymeric piezoelectric material in a heated liquid such as heated silicone oil.

In this process, if the polymeric piezoelectric material is deformed by linear expansion, it becomes difficult to produce a film that is flat in terms of practical use. Therefore, it is preferable to apply a temperature while applying a certain tensile stress (for example, from 0.01 MPa to 100 Mpa) to the polymeric piezoelectric material in order to prevent sagging of the polymeric piezoelectric material.

The temperature application time during the annealing treatment is preferably from 1 second to 60 minutes, more preferably from 1 second to 300 seconds, still more preferably from 1 second to 60 seconds. When the time for annealing is longer than 60 minutes, the orientation degree may decrease due to a growth of spherulites from molecular chains of an amorphous moiety at a higher temperature than the glass transition temperature of the polymeric piezoelectric material, thereby causing deterioration in the piezoelectricity and the transparency.

The polymeric piezoelectric material that has been subjected to the annealing treatment as described above is preferably rapidly cooled after the annealing treatment. In the annealing treatment, "rapidly cooling" refers to cooling the polymeric piezoelectric material that has been subjected to the annealing treatment, to a temperature at least the glass transition temperature Tg or lower, by immersing the polymeric piezoelectric material in ice water or the like immediately after the annealing treatment, without conducting any other treatments between the annealing treatment and the immersion in ice water or the like.

Examples of the method of rapidly cooling include a method of immersing the polymeric piezoelectric material that has been subjected to the annealing treatment in a refrigerant such as water, ice water, ethanol, ethanol or methanol in which dry ice is placed, or liquid nitrogen, and a method of spraying a liquid having a low vapor pressure to perform cooling by latent heat of vaporization. When the polymeric piezoelectric material is cooled in a serial manner, the polymeric piezoelectric material can be rapidly cooled by bringing a metal roll having a temperature that is controlled to be the glass transition temperature Tg or lower of the polymeric piezoelectric material into contact with the polymeric piezoelectric material. The number of times of cooling may be only one or two or more. The annealing and the cooling may be alternately repeated.

The process for producing the polymeric piezoelectric material in the present embodiment may include a process for stretching a sheet containing the optically active polymer (A) and the stabilizer (B), mainly in a uniaxial direction and a process for conducting an annealing treatment in this order. The stretching process and the process for conducting an annealing treatment may be similar to those described above. In this production process, the above-described preliminary crystallization process need not be performed.

A piezoelectric member in the present embodiment preferably includes an electrode in addition to the above-described polymeric piezoelectric material.

In a piezoelectric member in a more preferred embodiment, like the piezoelectric member 7, a polymeric piezoelectric material (for example, the PLA film 4) has two principal surfaces, and the principal surfaces are provided with electrodes (for example, the first electrode layer 2 and the second electrode layer 3). It is enough if the electrodes are provided to at least two planes of the polymeric piezoelectric material.

Materials for the electrodes are not particularly limited, and include, for example, Al, Ag, Au, Cu, Ag—Pd alloy, ITO, ZnO, IZO (registered trademark), and conductive polymers.

The piezoelectric member in the present embodiment may be a laminated piezoelectric element having a configuration such that the polymeric piezoelectric material and an electrode is piled up one another.

As an example of the laminated piezoelectric member, units of an electrode and a polymeric piezoelectric material are piled up recurrently and finally a principal plane of a polymeric piezoelectric material not covered by an electrode is covered by an electrode. Specifically, that with two recurrent units is a laminated piezoelectric element having an electrode, a polymeric piezoelectric material, an electrode, a polymeric piezoelectric material, and an electrode in the mentioned order. With respect to a polymeric piezoelectric material to be used for a laminated piezoelectric element, at least one layer of polymeric piezoelectric material is required to be made of a polymeric piezoelectric material according to the present embodiment, and other layers may not be made of a polymeric piezoelectric material according to the present embodiment.

When a laminated piezoelectric element contains a plurality of the polymeric piezoelectric materials according to the present embodiment, if the optically active polymer (A) contained in a polymeric piezoelectric material according to the present embodiment in a certain layer has L-form optical activity, the optically active polymer (A) contained in a polymeric piezoelectric material in another layer may be either of L-form and D-form. The arrangement of polymeric piezoelectric material may be suitably adjusted depending on the application of the piezoelectric member.

In the piezoelectric member, for example, it is preferable that if a first layer of a polymeric piezoelectric material containing as a main component an L-form optically active polymer (A) is laminated with a second polymeric piezoelectric material containing as a main component an L-form optically active polymer (A) while interposing an electrode, the uniaxial stretching direction (main stretching direction) of the first polymeric piezoelectric material crosses, preferably orthogonally crosses, the uniaxial stretching direction (main stretching direction) of the second polymeric piezoelectric material, so that since the directions of displacement of the first polymeric piezoelectric material and the second polymeric piezoelectric material are set equal, the piezoelectricity of a laminated piezoelectric element as a whole can be enhanced.

On the other hand, in the piezoelectric member, if the first layer of a polymeric piezoelectric material containing as a main component an L-form optically active polymer (A) is laminated with a second polymeric piezoelectric material containing as a main component a D-form optically active polymer (A) while interposing an electrode, the uniaxial stretching direction (main stretching direction) of the first polymeric piezoelectric material is arranged so as to be substantially parallel to the uniaxial stretching direction (main stretching direction) of the second polymeric piezoelectric material, so that it is preferable that since the displacement directions of the first polymeric piezoelectric material and the second polymeric piezoelectric material are set equal, the piezoelectricity of a laminated piezoelectric element as a whole can be enhanced.

The pressure detecting device in the present embodiment can be used as a touch panel in combination with a display device.

Namely, a touch panel according to one embodiment of the invention is provided with a pressure detecting device of this embodiment and a display device (for example, a liquid display panel and an organic electroluminescence display panel).

In the above-described touch panel, a positional relationship between the pressure detecting device and the display device of this embodiment is not limited especially.

For example, in the above-described touch panel, as viewed from the side on which the display device is visually confirmed (hereinafter also referred to as a "viewing side"), the pressure detecting device of this embodiment may be arranged at a position overlapping the display device (preferably, the viewing side of the display device, the same applies to the following), may be arranged at a position not overlapping the display device (for example, a position adjacent to the display device, the same applies to the following), or may be arranged both at the position overlapping the display device and at the position not overlapping the display device.

In the above-described touch panel, one or a plurality of the pressure detecting devices of this embodiment may be provided to one display device.

In the above-described touch panel, if the pressure detecting device of this embodiment is arranged at the position overlapping the display device as viewed from the viewing side, an electrode having transparency is preferably used as an electrode that can be included in a piezoelectric member of the pressure detecting device.

In the above-described touch panel, if the pressure detecting device of this embodiment is arranged at the position overlapping the display device as viewed from the viewing side, in order to enhance the visibility of the display device, a member having transparency is preferably used as a pressurized member included in the pressure detecting device.

In an electrode and a pressurized member, "having transparency" specifically means that an internal haze thereof is 20% or less (total light transmittance is 80% or more).

As one example of a touch panel according to the present embodiment, the touch panel includes a display device; a position detecting device arranged on the viewing side with respect to the display device; and a pressure sensing device arranged at a position not overlapping the display device as viewed from the viewing side, and at least one of the position detecting device or the pressure sensing device includes the pressure detecting device of this embodiment.

The position detecting device indicates a device which detects a position with which a position input means such as fingers or a touch pen comes in contact. The "position" as referred to herein includes positions in the X axis direction and the Y axis direction that are parallel to a display surface of the display device and that are perpendicular to each other, and a position in the Z axis direction that is perpendicular to the display surface of the display device. The "position in the Z axis direction" refers to a depth when the display device is depressed by the position detecting device. The depth corresponds to pressure (pressing force) generated when the display device is depressed by the position detecting device. The pressure detecting device of the present embodiment is suitable as the position detecting device for detecting the position in the Z axis direction. In this case, the position input means corresponds to the pressurizing means in this embodiment.

The sensing device is arranged at the position not overlapping the display device as viewed from the viewing side, and indicates a device for detecting pressing force applied by a pressurizing means such as fingers.

The sensing device may be a device for amplifying or attenuating pressing force detected by the position detecting device. In this case, an operator touching a touch panel inputs a position to the position detecting device with one hand (or fingers), and, at the same time, the operator applies pressure to the sensing device with the other hand (or fingers), so that the pressing force detected by the position detecting device can be amplified or attenuated.

It is preferable that two or more sensing devices are provided to one display device, and it is more preferable that three or more sensing devices are provided. For example, when the display device (display surface) has a rectangular shape as viewed from the viewing side, it is preferable that the sensing devices are provided at at least three positions among four positions adjacent to four corners of the display device. The pressure detecting device of the present embodiment is suitable as at least one of the sensing devices.

In the touch panel according to the above example, the pressure detecting device of the present embodiment may be included in only the position detecting device, only the sensing device, or both the position detecting device and the sensing device.

Further, in the touch panel according to the above example, if the pressure detecting device of this embodiment is included in both the position detecting device and the sensing device, a pressurized member of the pressure detecting device included in the position detecting device and a pressurized member of the pressure detecting device included in the sensing device may be common members.

If those pressurized members are common members, as a specific aspect, a first piezoelectric member is provided to one pressurized member (for example, a glass substrate or a resin substrate) at a position overlapping the display device as viewed from the viewing side, and a second piezoelectric member is provided at a position not overlapping the display device as viewed from the viewing side. In this aspect, one or a plurality of the first piezoelectric member and one or a plurality of the second piezoelectric member may be provided.

If the pressurized members are common members, as another specific aspect, a piezoelectric member may be provided to one pressurized member over from the position overlapping the display device to the position not overlapping the display device as viewed from the viewing side.

Hereinabove, although the pressure detecting device according to one embodiment (hereinafter also referred to as a "first embodiment") of the invention has been described, a pressure detecting device according to the following embodiment (hereinafter also referred to as a "second embodiment") other than the first embodiment is suitable as the pressure detecting device.

The pressure detecting device according to the second embodiment is provided with a pressurized member having a contact surface that is subjected to pressure due to contact with a pressurizing means; and a piezoelectric member that is arranged facing the pressurized member and that includes a polymeric piezoelectric material, and a product IEb of a cross-sectional secondary moment Ib and a Young's modulus Eb of the pressurized member, is in a range of from 10 GPa·mm$^4$ to $10^8$ GPa·mm$^4$.

As with the pressure detecting device according to the first embodiment, the pressure detecting device according to the second embodiment can be used as a touch panel in combination with a display device. A preferred embodiment of a touch panel is similar to a preferred embodiment of a touch panel using the pressure detecting device according to the first embodiment.

The present inventors have found that if IEb is in the range of from 10 GPa·mm$^4$ to $10^8$ GPa·mm$^4$, a generated charge density per unit quantity of deflection is high, that is, pressure applied to the contact surface of the pressurized member can be detected with high sensitivity as in the first embodiment.

Although the pressure detecting device according to the second embodiment is not limited to the aspect in which IEb/IEa is in a range of from $10^2$ to $10^{10}$, IEb should be in the range of from 10 GPa·mm$^4$ to $10^8$ GPa·mm$^4$. The pressure detecting device according to the second embodiment is similar to the pressure detecting device according to the first embodiment except for this point. A preferred embodiment of the pressure detecting device according to the second embodiment is similar to a preferred embodiment of the pressure detecting device according to the first embodiment. In the second embodiment, IEb is preferably from 10 GPa·mm$^4$ to $10^7$ GPa·mm$^4$, more preferably from 10 GPa·mm$^4$ to $10^6$ GPa·mm$^4$, particularly preferably $10^2$ GPa·mm$^4$ to $10^5$ GPa·mm$^4$.

EXAMPLES

Hereinafter, the embodiments of the invention are further specifically described with reference to the Examples, but the embodiments are not limited to the following Examples to the extent not to depart from the spirit of the embodiment.

[Production of Piezoelectric Sheet (Polylactic Acid Film: PLA Film)]

0.1 parts by mass of a stabilizer B1-1 as the stabilizer (B) having the following structure was added to 100 parts by mass of a polylactic acid-based resin (registered trademark LACEA, H-400, weight average molecular weight Mw: 200,000, produced by Mitsui Chemicals, Inc.) to produce a source material as a dry blend.

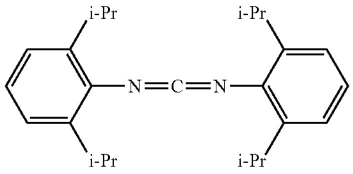

Stabilizer B1-1
B2756 or
Stabaxol I

The produced source material was charged into an extruder hopper to be extruded through a T-die while being heated to 220° C. to 230° C., and, thus, to be brought into contact with a cast roll at 55° C. for 0.5 min, whereby a preliminarily crystallized sheet having a thickness of 150 μm was formed (preliminarily crystallization process). When the crystallinity of the preliminarily crystallized sheet was measured, it was 5.63%.

Stretching of the obtained preliminarily crystallized sheet was started at a stretching rate of 1,650 mm/min by a roll-to-roll method while heating the preliminarily crystallized sheet at 70° C., and the preliminarily crystallized sheet was uniaxially stretched in an MD direction to 3.3 times (stretching process). The thickness of the obtained film was 0.05 mm.

Thereafter, the uniaxially stretched film was brought into contact with a roll, heated to 130° C., for 60 seconds by a roll-to-roll method to be subjected to an annealing treatment, and, thus, to produce a polymeric piezoelectric material (PLA film) (annealing treatment process).

[Measurement and Evaluation of Physical Properties]

In the polymeric piezoelectric material obtained as described above, the weight average molecular weight, the melting point (Tm), the crystallinity, the internal haze, MORc, and the piezoelectric constant $d_{14}$ were measured. The results are shown in Table 1.

Specifically, the physical properties were measured as described below.

<Molecular Weight Distribution (Mw/Mn) and Weight Average Molecular Weight of Optically Active Polymer>

The molecular weight distribution (Mw/Mn) and the weight average molecular weight (Mw) of resin (optically active polymer) contained in the polymeric piezoelectric material were calculated by the above-described GPC measuring method.

The results are shown in Table 1.

<Melting Point, Crystallinity>

The polymeric piezoelectric material was precisely weighed to 10 mg, and the temperature was increased to 140° C. at a rate of temperature increase of 500° C./min using a differential scanning calorimeter (DSC-1 manufactured by PerkinElmer, Inc.) and further increased to 200° C. at a rate of temperature increase of 10° C./min, thereby obtaining a melt endothermic curve. The melting point Tm and the crystallinity were obtained from the obtained melt endothermic curve.

<Internal Haze>

As used herein, "internal haze" refers to an internal haze of a polymeric piezoelectric material, and is measured by an ordinary method.

Specifically, the internal haze value of each of the polymeric piezoelectric materials of the Examples was measured by measuring the light transmittance in the thickness direction using the following apparatus under the following conditions. More specifically, The haze (H2) was measured by placing in advance only a silicone oil (Shin-Etsu Silicone (trade mark), grade: KF96-100CS; by Shin-Etsu Chemical Co., Ltd.) between two glass plates, and then the haze (H3) was measured by placing a film, whose surfaces were wetted uniformly with the silicone oil, between two glass plates. The internal haze (H1) of a polymeric piezoelectric material according to the present embodiment was obtained by calculating the difference between the two according to the following equation.

$$\text{Internal haze } (H1) = \text{Haze } (H3) - \text{Haze } (H2)$$

The haze (H2) and haze (H3) were determined by measuring the light transmittance in the thickness direction using the following apparatus under the following measuring conditions:

Measurement device: HAZE METER TC-H III DPK, manufactured by Tokyo Denshoku CO., LTD.

Sample size: 3 mm in width×30 mm in length, 0.05 mm in thickness

Measurement conditions: in conformity with JIS-K7105

Measurement temperature: room temperature (25° C.)

<Standardized Molecular Orientation MORc>

The standardized molecular orientation MORc was measured by a microwave type molecular orientation meter MOA-6000, manufactured by Oji Scientific Instruments Co., Ltd. The reference thickness tc was set to 50 μm.

<Piezoelectric Constant $d_{14}$ (Displacement Method)>

The piezoelectric constant $d_{14}$ of the polymeric piezoelectric material was measured by the above-described measuring method (displacement method).

TABLE 1

| Optically active polymer (A) | | | | | Stabilizer (B) | | Physical properties of polymeric piezoelectric material | | | | | |
|---|---|---|---|---|---|---|---|---|---|---|---|---|
| Resin | Chirality | Mw | Mw/Mn | Optical purity (% ee) | Type | Molecular weight | Tm (° C.) | Crystallinity (%) | MORc @ 50 μm | MORc × Crystallinity | Internal haze (%) | Piezoelectric constant (pm/V) |
| LA | L | 200,000 | 2.87 | 98.5 | B1-1 | 363 | 164.6 | 39.8 | 4.73 | 188 | 0.0 | 6.2 |

Example 1

A PLA film having a width of 50 mm and a length of 90 mm was cut out from the produced polymeric piezoelectric material (PLA film) to form Al deposited electrode layers (each having a length of 50 nm) on front and back surfaces of the cut out PLA film, and, thus, to provide a piezoelectric member. Those Al deposited electrode layers were formed using SIP-600 manufactured by Showa Shinku Co., Ltd., as in an Al deposited layer in the measurement of the piezoelectric constant (displacement method).

As a pressurized member (base material), a vinyl chloride plate produced by Takiron Co., Ltd. having the size shown in the following Table 2 (length×width×thickness) was provided.

<Cross-sectional Secondary Moment>

The cross-sectional secondary moment (Ia) of the above-described piezoelectric member was obtained in accordance with the above equation (a), based on the thickness and the width of the piezoelectric member.

The cross-sectional secondary moment (Ib) of the above-described pressurized member (base material) was obtained in accordance with the equation "Ib=Fixed end distance×(thickness of the member)$^3$/12" based on the thickness of the above-described pressurized member (base material) and the fixed end interval in the width direction described below.

In this case, a value obtained when a principal surface of each member was installed horizontally and the axis was defined horizontally was defined as the cross-sectional secondary moment.

<Young's Modulus>

The Young's moduli (Ea and Eb) of the piezoelectric member and the pressurized member (base material) were measured by a tensile testing method in conformity with JIS K7127, using a No. 1 dumbbell specimen specified in JIS K6251. The Young's moduli of the piezoelectric member and the pressurized member (base material) were each obtained as a slope (a linear portion) of an elastic range in a stress-strain diagram obtained by this specimen and this testing method.

[Manufacturing of Pressure Detecting Device]

A pressure detecting device having a configuration similar to that of the pressure detecting device 10 shown in FIG. 1 was manufactured, using the above-described piezoelectric member and the above-described pressurized member (base material).

Here, as a support frame 5, there was used a member formed of hard vinyl chloride and having a square frame shape formed by cutting out a tetrahedron, having a size of 100 mm×54 mm×6 mm in thickness, from a center of a tetrahedron having a size of 130 mm×80 mm×6 mm in thickness.

A pressurized member (base material) 6 and the support frame 5 were arranged so that their outer circumferences overlapped each other, and they were applied to each other through a double-sided tape (not shown). In this example, the fixed end interval in the width direction of the pressurized member (base material) 6 is 54 mm.

A piezoelectric member 7 and the pressurized member (base material) 6 were arranged so that their centers overlap each other (namely, they were arranged such that the center of the piezoelectric member 7 and the center of the inner circumference of the support frame 5 overlap each other), and they were applied to each other through a double-sided tape 1.

A copper foil tape with a conductive adhesive layer was applied to the Al deposited electrode layers on both sides of piezoelectric member, thus contributing to electrical conduction.

<Generated Charge Density>

Figure 3:
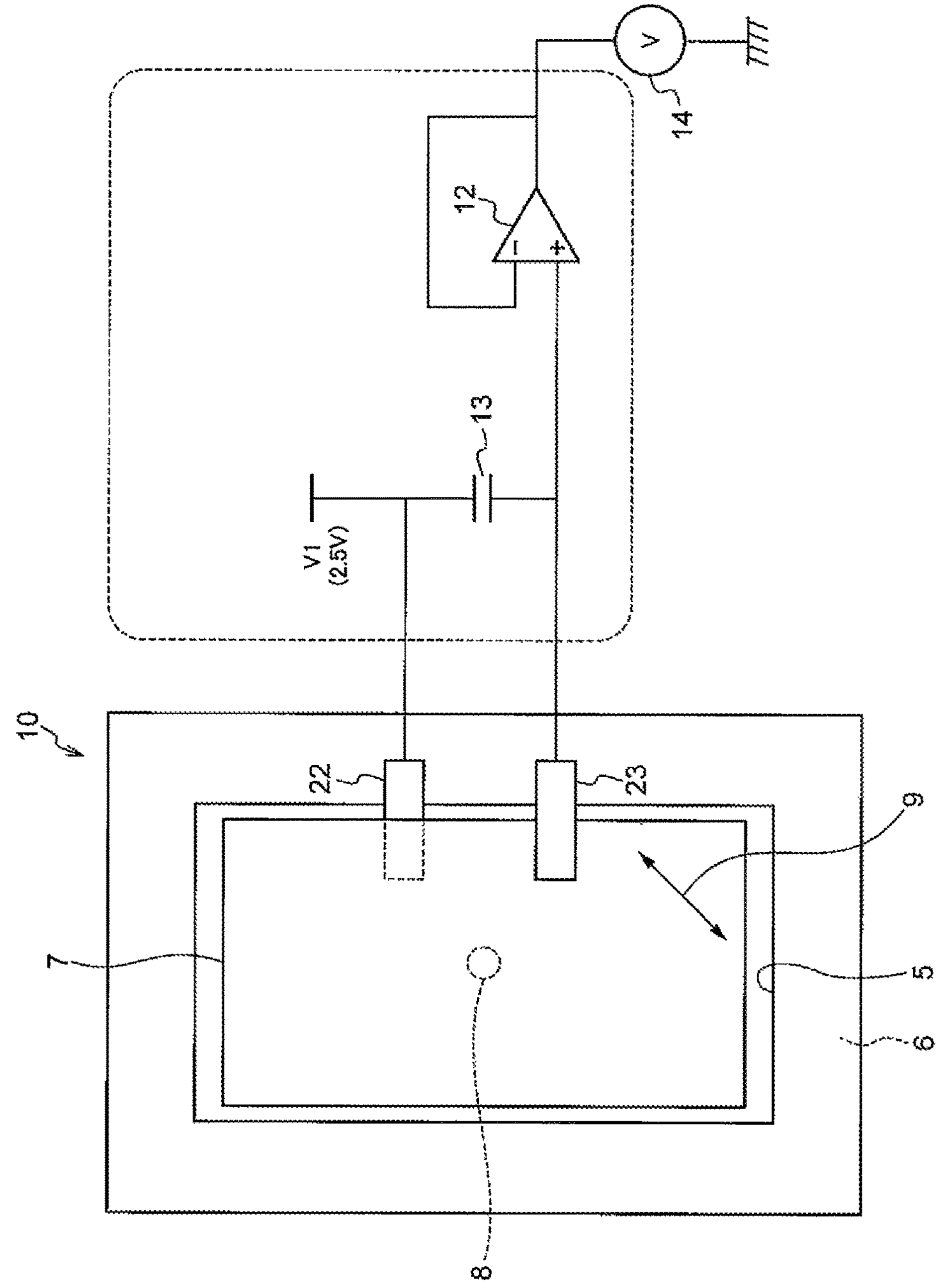
FIG. 3 is a view schematically showing a circuit configuration used in measurement of a generated charge density in Examples.

A copper wire included in a circuit shown in FIG. 3 was connected to the copper foil tape by soldering, whereby the pressure detecting device was connected to the circuit shown in FIG. 3.

In this circuit, an electric charge generated by a piezoelectric effect is stored in a capacitor 13 of 100 nF in the circuit, voltages at both ends of the capacitor 13 is read by an AD converter 14 through a buffer amplifier constituted of an OP amplifier 12. A value obtained by multiplying the voltage value thus read by a capacitance of 100 nF of the capacitor 13 in the circuit is an amount of generated electric charge. A value obtained by dividing the generated electric charge by an area of an Al deposited electrode (45 cm$^2$ (=5 cm×9 cm) is a generated charge density.

Thus, the generated charge density was measured.

<Generated Charge Density per Unit Quantity of Deflection>

An extrusion rod as the pressurizing means 8 shown in FIG. 1 is connected to a load cell of a cross head portion of tensile tester TENSILON RTG-1250 manufactured by A&D Company, Limited.

A method of measuring the generated charge density per unit quantity of deflection will be described.

The pressurizing means 8 (in this case, an extrusion rod) shown in FIG. 1 is brought vertically into contact with a central portion of the contact surface 6A of the base material 6 so as to be vertical to the contact surface 6A, and a pressing force is applied to the base material 6 at a cross head speed of 5 mm/min. The pressing force is measured by a load cell of a tensile tester, and as the pressing pressure reaches 5 N corresponding to the pressing force of a human finger, the travelling direction of the cross head is inverted to reduce the pressing pressure. As the pressing pressure reaches 0 N, the travelling direction of the cross head is inverted again. As the pressing pressure is increased to reach 5 N, the force is reduced.

The above cycle is repeated ten times, and the amount of electric charge generated during the cycles is read through the circuit shown in FIG. 3. For the quantity of deflection, an output voltage of a tensile tester is read by the AD converter and then converted into the quantity of deflection using a proportional constant.

A value obtained by dividing (maximum value−minimum value) of the generated charge density by (maximum value−minimum value) of the quantity of deflection is the generated charge density per unit quantity of deflection.

Examples 2 to 5 and Comparative Example 1

A pressure detecting device was manufactured similarly to Example 1, except that a piezoelectric member and a pressurized member (base material) were changed as shown in Table 2, and evaluation was performed.

The results are shown in Table 2.

TABLE 2

| | | Example 1 | Example 2 | Example 3 | Example 4 | Example 5 | Comparative example 1 |
|---|---|---|---|---|---|---|---|
| Piezoelectric member | Thickness (mm) | 0.05 | 0.05 | 0.05 | 0.05 | 0.05 | 0.05 |
| | Width (mm) | 50 | 50 | 50 | 50 | 50 | 50 |
| | Young's modulus Ea (GPa) | 3.0 | 3.0 | 3.0 | 3.0 | 3.0 | 3.0 |
| | Cross-sectional secondary moment Ia ($mm^4$) | 5.2E−04 | 5.2E−04 | 5.2E−04 | 5.2E−04 | 5.2E−04 | 5.2E−04 |
| | IEa(=Ia × Ea) (GPa · $mm^4$) | 1.6E−03 | 1.6E−03 | 1.6E−03 | 1.6E−03 | 1.6E−03 | 1.6E−03 |
| Pressurized member (base material) | Width (mm) | 80 | 80 | 80 | 80 | 80 | 80 |
| | Fixed end distance (width direction) (mm) | 54 | 54 | 54 | 54 | 54 | 54 |
| | Thickness (mm) | 20.00 | 10.00 | 6.00 | 3.00 | 2.00 | 0.18 |
| | Length (mm) | 130 | 130 | 130 | 130 | 130 | 130 |
| | Material | Vinyl chloride resin | Vinyl chloride resin | Vinyl chloride resin | Vinyl chloride resin | Vinyl chloride resin | Vinyl chloride resin |
| | Young's modulus Eb (GPa) | 3.1 | 3.1 | 3.1 | 3.1 | 3.1 | 3.1 |
| | Cross-sectional secondary moment Ib ($mm^4$) | 3.6E+04 | 4.5E+03 | 9.7E+02 | 1.2E+02 | 3.6E+01 | 2.6E−02 |
| | IEb (=Ib × Eb) (GPa · $mm^4$) | 1.1E+05 | 1.4E+04 | 3.0E+03 | 3.8E+02 | 1.1E+02 | 8.1E−02 |
| IEb/IEa | | 7.1E+07 | 8.9E+06 | 1.9E+06 | 2.4E+05 | 7.1E+04 | 5.2E+01 |
| Quantity of deflection (mm) | | 0.016 | 0.017 | 0.023 | 0.058 | 0.081 | 0.957 |
| Maximum charge density ($nC/cm^2$) | | 0.0085 | 0.0150 | 0.0233 | 0.0300 | 0.0130 | 0.0692 |
| Generated charge density per unit quantity of deflection ($pC/cm^2$ · mm) | | 0.53 | 0.88 | 1.01 | 0.52 | 0.16 | 0.07 |

(Description of Table 2)

The cross-sectional secondary moment is a value obtained when a principal surface is installed horizontally and an axis is defined horizontally.

In Examples 1 to 4, a vinyl chloride plate produced by Takiron Co., Ltd. (the thickness is as shown in Table 2) was used as a base material.

In Example 5 and Comparative example 1, a vinyl chloride plate "Unisundae" produced by Hikari Co., Ltd. (the thickness is as shown in Table 2) was used as a base material.

The description of "(numerical value a) E (numerical value b)" represents "(numerical value a)$\times 10^{(numerical\ value\ b)}$". For example, "5.2E-04" represents $5.2\times 10^{-4}$.

As shown in Table 2, it was confirmed that IEb/IEa is in a range of from $10^2$ to $10^{10}$ and the generated charge density per unit quantity of deflection was high. In particular, if IEb/IEa is in a range of from $10^4$ to $10^9$ (in particular, a range of from $10^4$ to $10^8$ (especially, a range of from $10^5$ to $10^8$)), it was confirmed that the generated charge density per unit quantity of deflection was particularly high.

The entire disclosure of Japanese Patent Application No. 2013-104398 filed May 16, 2013 is incorporated by reference in this specification.

All contents of the documents, patent applications, and technical standards described in this specification are incorporated herein by reference to the same extent as that when it is specifically and individually described that the respective documents, patent applications, and the technical standards are incorporated herein by reference.

The invention claimed is:

1. A pressure detecting device comprising:

a pressurized member having a contact surface that is subjected to pressure due to contact with a pressurizing means;

a piezoelectric member that is arranged facing the pressurized member and that includes a polymeric piezoelectric material having a piezoelectric constant $d_{14}$ of 1 pm/v or more as measured by a displacement method at 25° C; and a relaxing portion that has a Young's modulus of 0.1 GPa or less and that is provided on an opposite side, from the pressurized member side, of the piezoelectric member, wherein a ratio IEb/IEa between a product IEb of a cross-sectional secondary moment Ib and a Young's modulus Eb of the pressurized member, and a product IEa of a cross-sectional secondary moment Ia and a Young's modulus Ea of the piezoelectric member, is in a range of from $10^5$ to $10^8$.

2. The pressure detecting device according to claim 1, further comprising:

a support means configured to support the pressurized member against pressure that is applied from the contact surface; and a support means configured to support the piezoelectric member against pressure that is applied from the contact surface through the pressurized member.

3. The pressure detecting device according to claim 1, wherein a direction in which pressure is applied from the contact surface and a molecular orientation direction of the polymeric piezoelectric material cross each other.

4. The pressure detecting device according to claim 1, wherein a thickness of the pressurized member is in a range of from 0.2 mm to 20 mm.

5. The pressure detecting device according to claim 1, wherein the Young's modulus Eb of the pressurized member is from 1 GPa to 200 GPa.

6. The pressure detecting device according to claim 1, wherein the polymeric piezoelectric material contains a helical chiral polymer having a weight average molecular weight of from 50,000 to 1,000,000 and optical activity, and has a crystallinity as obtained by a DSC method of from 20% to 80%, and a product of a standardized molecular orientation MORc, which is measured with a microwave transmission-type molecular orientation meter at a reference thickness of 50 μm , and the crystallinity is from 40 to 700.

7. The pressure detecting device according to claim 1, wherein an internal haze of the polymeric piezoelectric material with respect to visible light is 10% or less.

8. The pressure detecting device according to claim 6, wherein the MORc is from 3.5 to 15.0.

9. The pressure detecting device according to claim 6, wherein the helical chiral polymer is a polylactic acid-based polymer having a main chain that contains a repeating unit represented by the following Formula (1):

(1)

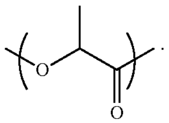

10. The pressure detecting device according to claim 6, wherein the helical chiral polymer has an optical purity of 95.00% ee or more.

11. The pressure detecting device according to claim 6, wherein a content of the helical chiral polymer in the polymeric piezoelectric material is 80% by mass or more.

12. The pressure detecting device according to claim 6, wherein the polymeric piezoelectric material further contains a stabilizer:

having one or more functional groups selected from the group consisting of a carbodiimide group, an epoxy group, and an isocyanate group, having a weight average molecular weight of from 200 to 60,000, and being contained in an amount from 0.01 parts by mass to 10 parts by mass based on 100 parts by mass of the helical chiral polymer.

13. The pressure detecting device according to claim 12, wherein the stabilizer has, in one molecule, one functional group selected from the group consisting of a carbodiimide group, an epoxy group, and an isocyanate group.

14. A touch panel comprising the pressure detecting device according to claim 1 and a display device.

15. The pressure detecting device according to claim 1, wherein the cross-sectional secondary moment Ib of the pressurized member is from $10^{-1}$ $mm^4$ to $10^5$ $mm^4$.

* * * * *